United States Patent
Yamanaka et al.

(10) Patent No.: US 11,758,728 B2
(45) Date of Patent: Sep. 12, 2023

(54) SEMICONDUCTOR DEVICE AND METHOD OF MANUFACTURING THE SAME

(71) Applicant: Kioxia Corporation, Tokyo (JP)

(72) Inventors: Takanori Yamanaka, Yokkaichi Mie (JP); Ryota Fujitsuka, Yokkaichi Mie (JP); Hiroki Kishi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 51 days.

(21) Appl. No.: 17/394,548

(22) Filed: Aug. 5, 2021

(65) Prior Publication Data

US 2022/0302159 A1 Sep. 22, 2022

(30) Foreign Application Priority Data

Mar. 18, 2021 (JP) ................................. 2021-045069

(51) Int. Cl.
| | | |
|---|---|---|
| *H01L 21/02* | (2006.01) | |
| *H10B 43/27* | (2023.01) | |
| *H01L 29/792* | (2006.01) | |
| *H01L 29/66* | (2006.01) | |
| *H10B 43/35* | (2023.01) | |

(52) U.S. Cl.
CPC ......... *H10B 43/27* (2023.02); *H01L 21/0214* (2013.01); *H01L 29/66833* (2013.01); *H01L 29/7926* (2013.01); *H10B 43/35* (2023.02)

(58) Field of Classification Search
CPC .................. H01L 21/0214; H01L 29/7926
See application file for complete search history.

(56) References Cited

U.S. PATENT DOCUMENTS

| | | |
|---|---|---|
| 9,831,118 B1 | 11/2017 | Pang et al. |
| 10,910,401 B2 | 2/2021 | Sawa et al. |
| 10,950,621 B2 | 3/2021 | Ono et al. |
| 10,971,515 B2 | 4/2021 | Kobayashi et al. |
| 2017/0263627 A1 | 9/2017 | Furuhashi et al. |
| 2020/0058676 A1 | 2/2020 | Ono et al. |
| 2020/0075625 A1 | 3/2020 | Kobayashi et al. |
| 2020/0295035 A1 | 9/2020 | Sawa et al. |
| 2020/0303393 A1* | 9/2020 | Fujitsuka ............ H01L 29/4234 |
| 2020/0388686 A1* | 12/2020 | Eom ................ H01L 21/02244 |

FOREIGN PATENT DOCUMENTS

| | | |
|---|---|---|
| JP | 2017168527 A | 9/2017 |
| JP | 2020031204 A | 2/2020 |
| JP | 2020035913 A | 3/2020 |
| JP | 2020150227 A | 9/2020 |
| JP | 2020155482 A | 9/2020 |
| TW | 202036864 A | 10/2020 |
| TW | I714183 B | 12/2020 |

* cited by examiner

*Primary Examiner* — Mohammad M Choudhry
(74) *Attorney, Agent, or Firm* — Holtz, Holtz & Volek PC

(57) ABSTRACT

In one embodiment, a semiconductor device includes a stacked film alternately including a plurality of electrode layers and a plurality of insulating layers, a charge storage layer provided on a side face of the stacked film via a first insulator, and a semiconductor layer provided on a side face of the charge storage layer via a second insulator. The device further includes a third insulator provided between an electrode layer and an insulating layer in the stacked film and between the electrode layer and the first insulator, and a first film provided between the third insulator and the insulating layer and/or between the third insulator and the first insulator, and including carbon, germanium, tin, aluminum, phosphorus or arsenic.

4 Claims, 26 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2021-045069, filed on Mar. 18, 2021, the entire contents of which are incorporated herein by reference.

FIELD

Embodiments described herein relate to a semiconductor device and a method of manufacturing the same.

BACKGROUND

When a stacked film is to be formed to alternately include a plurality of electrode layers and a plurality of insulating layers, a problem may occur in the insulating layers of the stacked film and an insulator near the stacked film.

DETAILED DESCRIPTION

Embodiments will now be explained with reference to the accompanying drawings. In FIGS. 1 to 26, the same configurations are denoted by the same reference signs, and redundant description thereof is omitted.

In one embodiment, a semiconductor device includes a stacked film alternately including a plurality of electrode layers and a plurality of insulating layers, a charge storage layer provided on a side face of the stacked film via a first insulator, and a semiconductor layer provided on a side face of the charge storage layer via a second insulator. The device further includes a third insulator provided between an electrode layer and an insulating layer in the stacked film and between the electrode layer and the first insulator, and a first film provided between the third insulator and the insulating layer and/or between the third insulator and the first insulator, and including carbon, germanium, tin, aluminum, phosphorus or arsenic.

First Embodiment

Figure 1:
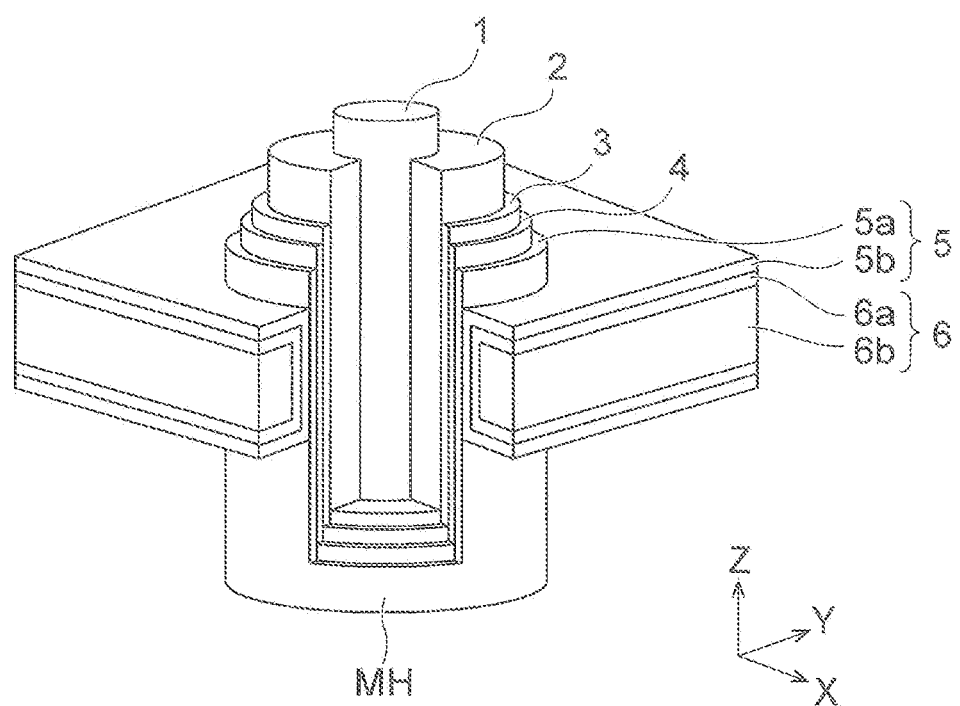
FIG. 1 is a perspective view illustrating a structure of a semiconductor device of a first embodiment.

FIG. 1 is a perspective view illustrating a structure of a semiconductor device of a first embodiment. The semiconductor device in FIG. 1 is, for example, a three-dimensional semiconductor memory.

The semiconductor device in FIG. 1 includes a core insulator 1, a channel semiconductor layer 2, a tunnel insulator 3, a charge storage layer 4, a block insulator 5, and an electrode layer 6. The block insulator 5 includes an insulator 5a and an insulator 5b. The electrode layer 6 includes a barrier metal layer 6a and an electrode material layer 6b. The insulator 5a is an example of a first insulator, and the tunnel insulator 3 is an example of a second insulator. The insulator 5b is an example of a third insulator, and the channel semiconductor layer 2 is an example of a semiconductor layer.

In the semiconductor device in FIG. 1, a plurality of electrode layers and a plurality of insulating layers are alternately stacked on a substrate, and a plurality of memory holes are provided in these electrode layers and these insulating layers. FIG. 1 illustrates the electrode layer 6 as one of these electrode layers and a memory hole MH as one of these memory holes. These electrode layers function as, for example, a word line or a selection line.

FIG. 1 illustrates: an X direction and a Y direction that are parallel to a surface of the substrate and are perpendicular to each other; and a Z direction that is perpendicular to the surface of the substrate. Herein, the +Z direction is defined as an upward direction, and the −Z direction is defined as a downward direction. The −Z direction may coincide with the gravity direction, and may not coincide with the gravity direction. In FIG. 1, the electrode layer 6 spreads in the X direction and the Y direction, and the memory hole MH extends in the Z direction.

The core insulator 1, the channel semiconductor layer 2, the tunnel insulator 3, the charge storage layer 4, and the insulator 5a are formed in the memory hole MH, and constitute a memory cell transistor (memory cell) and a selection transistor in the three-dimensional semiconductor memory, together with the electrode layers.

The insulator 5a is formed on surfaces of the electrode layers and the insulating layers in the memory hole MH, and the charge storage layer 4 is formed on a surface of the insulator 5a. The charge storage layer 4 is provided to store signal charges in the memory cell transistor. The tunnel insulator 3 is formed on a surface of the charge storage layer 4, and the channel semiconductor layer 2 is formed on a surface of the tunnel insulator 3. The channel semiconductor layer 2 functions as channels of the memory cell transistor and the selection transistor. The core insulator 1 is formed in the channel semiconductor layer 2.

The insulator 5a is, for example, an $SiO_2$ film (silicon oxide film). The charge storage layer 4 is, for example, an SiN film (silicon nitride film). The tunnel insulator 3 is, for example, an SiON film (silicon oxynitride film). The channel semiconductor layer 2 is, for example, a polysilicon layer. The core insulator 1 is, for example, an $SiO_2$ film.

The insulator 5b, the barrier metal layer 6a, and the electrode material layer 6b are formed between the insulating layers adjacent to each other, and are formed in the stated order on a lower face of the upper insulating layer, an upper face of the lower insulating layer, and a side face of the insulator 5a. The insulator 5b is, for example, a metal insulator such as an $Al_2O_3$ film (aluminum oxide film). The barrier metal layer 6a is, for example, a TiN film (titanium nitride film). The electrode material layer 6b is, for example, a W (tungsten) layer.

Figure 2:
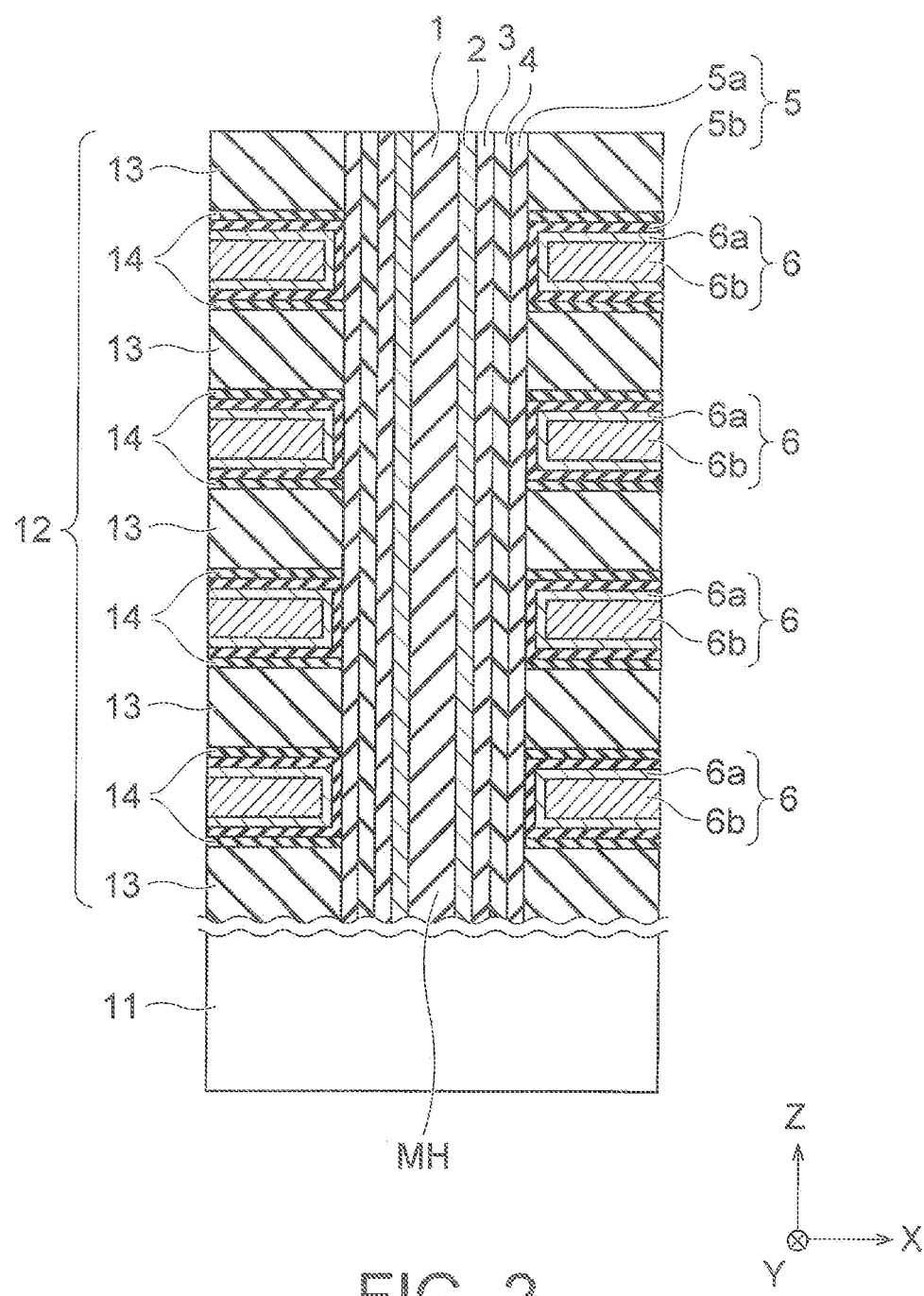
FIG. 2 is a cross-sectional view illustrating the structure of the semiconductor device of the first embodiment.

FIG. 2 is a cross-sectional view illustrating the structure of the semiconductor device of the first embodiment. FIG. 2 illustrates an XZ cross-section of the memory hole MH in FIG. 1.

As illustrated in FIG. 2, the semiconductor device of the present embodiment includes the core insulator 1, the channel semiconductor layer 2, the tunnel insulator 3, the charge storage layer 4, the block insulator 5, the plurality of electrode layers 6, a substrate 11, a stacked film 12, a plurality of insulating layers 13, and a plurality of films 14. The films 14 are an example of a first film. In FIG. 2, the block insulator 5 includes the insulator 5a and the plurality of insulators 5b, and each electrode layer 6 includes the barrier metal layer 6a and the electrode material layer 6b. The semiconductor device of the present embodiment further includes the memory hole MH.

The substrate 11 is, for example, a semiconductor substrate such as an Si (silicon) substrate. Similarly to FIG. 1, FIG. 2 illustrates: the X direction and the Y direction that are parallel to a surface of the substrate 11 and are perpendicular to each other; and the Z direction that is perpendicular to the surface of the substrate 11.

The stacked film 12 includes the plurality of electrode layers 6 and the plurality of insulating layers 13 that are alternately stacked on the substrate 11. The stacked film 12 may be formed directly on the substrate 11, and may be formed on the substrate 11 via another layer. The insulating layers 13 are, for example, $SiO_2$ films. The thickness of each insulating layer 13 is, for example, 10 to 40 nm.

The stacked film 12 further includes the plurality of insulators 5b and the plurality of films 14. The stacked film 12 includes one insulator 5b and two films 14 on a surface of each electrode layer 6. Each insulator 5b is formed on an upper face, a lower face, and a side face of its corresponding electrode layer 6. Moreover, each film 14 is formed on the upper face or the lower face of its corresponding electrode layer 6 via the insulator 5b. Therefore, each insulator 5b and each film 14 are sandwiched between the electrode layer 6 and the insulating layer 13 that are adjacent to each other in the Z direction. Between the insulating layers 13 that are adjacent to each other in the Z direction, the total thickness of one electrode layer 6 and one insulator 5b is, for example, 10 to 40 nm.

The films 14 of the present embodiment include C (carbon), Ge (germanium), Sn (tin), Al (aluminum), P (phosphorus), or As (arsenic). In the case where the films 14 include C, the films 14 are, for example, SiCN films, SiOC films, or SiOCN films (N denotes nitrogen, and O denotes oxygen). Moreover, in the case where the films 14 include another element, the films 14 are, for example, SiGe films, SiGeN films, or SiBN films. The films 14 may include, for example, Si and at least any one of C, Ge, Sn, Al, P, and As. The thickness of each film 14 is, for example, 1 to 5 nm. Moreover, the concentration of C, Ge, Sn, Al, P, or As included in each film 14 is, for example, 5 to 50 atomic %.

The insulator 5a, the charge storage layer 4, the tunnel insulator 3, the channel semiconductor layer 2, and the core insulator 1 are formed in the stated order on a side face of the stacked film 12 inside of the memory hole MH. Therefore, the insulator 5a is formed on a side face of each insulating layer 13, and is formed on a side face of each electrode layer 6 via each insulator 5b. The charge storage layer 4 is formed on the side face of the stacked film 12 via the insulator 5a, and the channel semiconductor layer 2 is formed on a side face of the charge storage layer 4 via the tunnel insulator 3.

FIGS. 3 to 6 are cross-sectional views illustrating a method of manufacturing the semiconductor device of the first embodiment.

Figure 3:
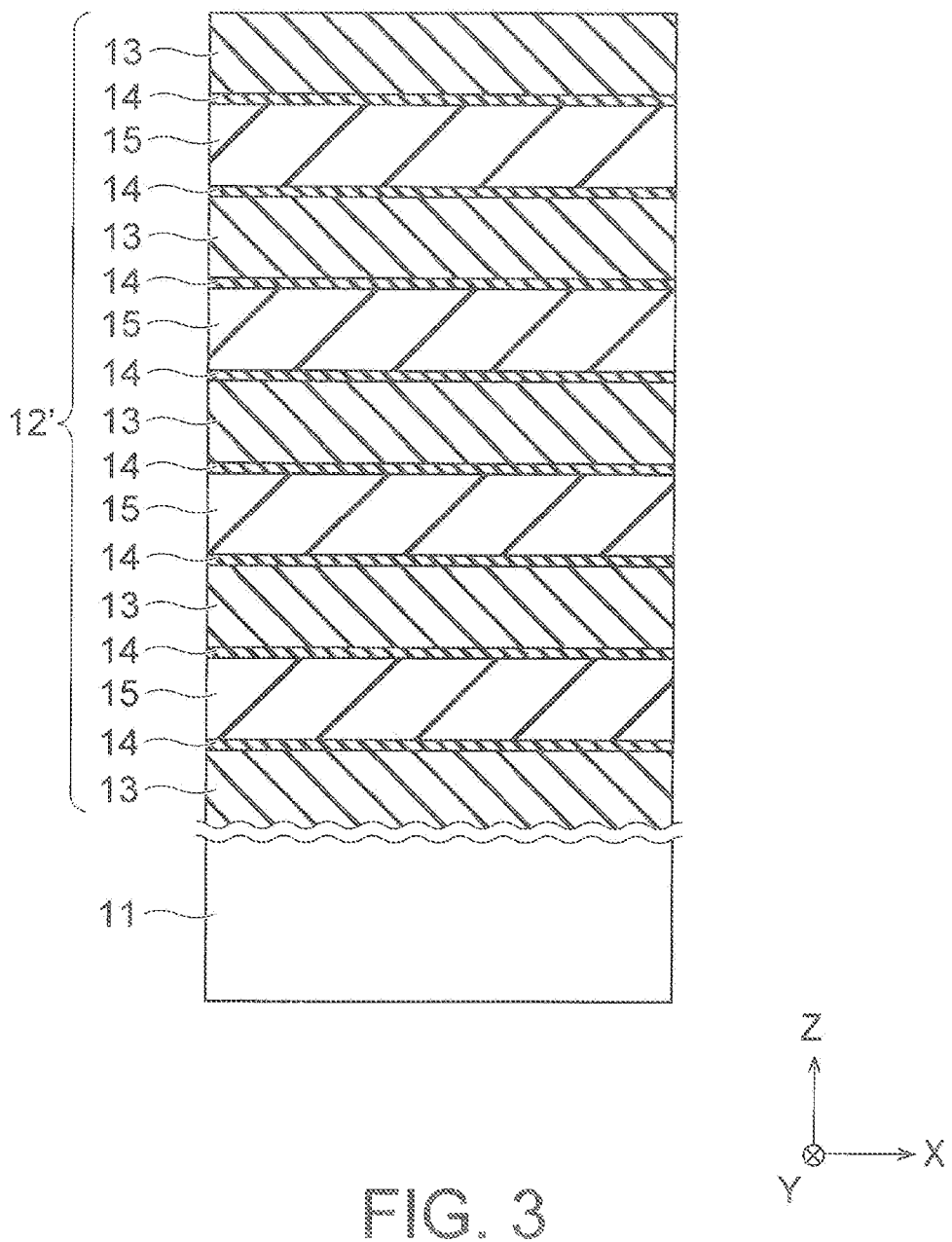
FIGS. 3 to 6 are cross-sectional views illustrating a method of manufacturing the semiconductor device of the first embodiment.

First, a stacked film 12' is formed on the substrate 11 (FIG. 3). The stacked film 12' is formed by alternately forming the plurality of insulating layers 13 and a plurality of sacrificial layers 15 on the substrate 11. At this time, the films 14 are respectively formed between the insulating layers 13 and the sacrificial layers 15 that are adjacent to each other in the Z direction. Specifically, at the time of forming the sacrificial layers 15 on the insulating layers 13, the sacrificial layers 15 are respectively formed on the insulating layers 13 via the films 14. Similarly, at the time of forming the insulating layers 13 on the sacrificial layers 15, the insulating layers 13 are respectively formed on the sacrificial layers 15 via the films 14. As a result, the stacked film 12' including the plurality of insulating layers 13, the plurality of films 14, and the plurality of sacrificial layers 15 is formed. The sacrificial layers 15 are formed in order to be replaced with the electrode layers 6 and the insulators 5b in a process to be described later. The sacrificial layers 15 are an example of a first layer.

The insulating layers 13 are, for example, $SiO_2$ films, and are formed by CVD (chemical vapor deposition) using TEOS (tetraethyl orthosilicate), $O_2$ gas, and Ar (argon) gas. The films 14 are, for example, SiCN films, and are formed by CVD using $(CH_3)_3SiH$ gas and $NH_3$ gas (H denotes hydrogen). The concentration of C included in the films 14 is set to, for example, 5 to 50 atomic %. The sacrificial layers 15 are, for example, SiN films, and are formed using $SiH_4$ gas, $NH_3$ gas, and $N_2$ gas. The thickness of each sacrificial layer 15 is, for example, 10 to 40 nm.

Figure 4:
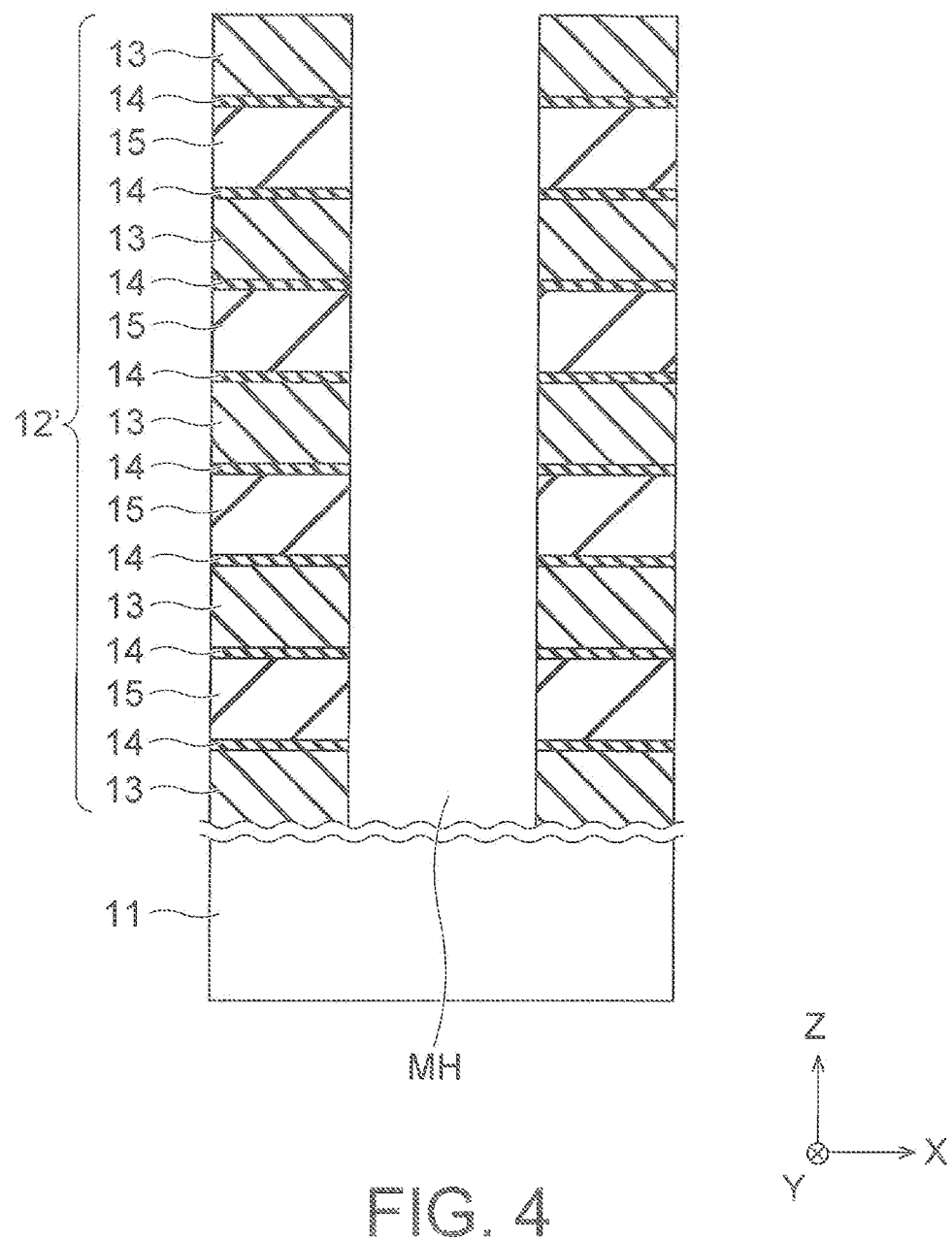

Next, the memory hole MH is formed in the stacked film 12' by lithography and RIE (reactive ion etching) (FIG. 4). The memory hole MH of the present embodiment is processed into a columnar shape extending in the Z direction.

Figure 5:
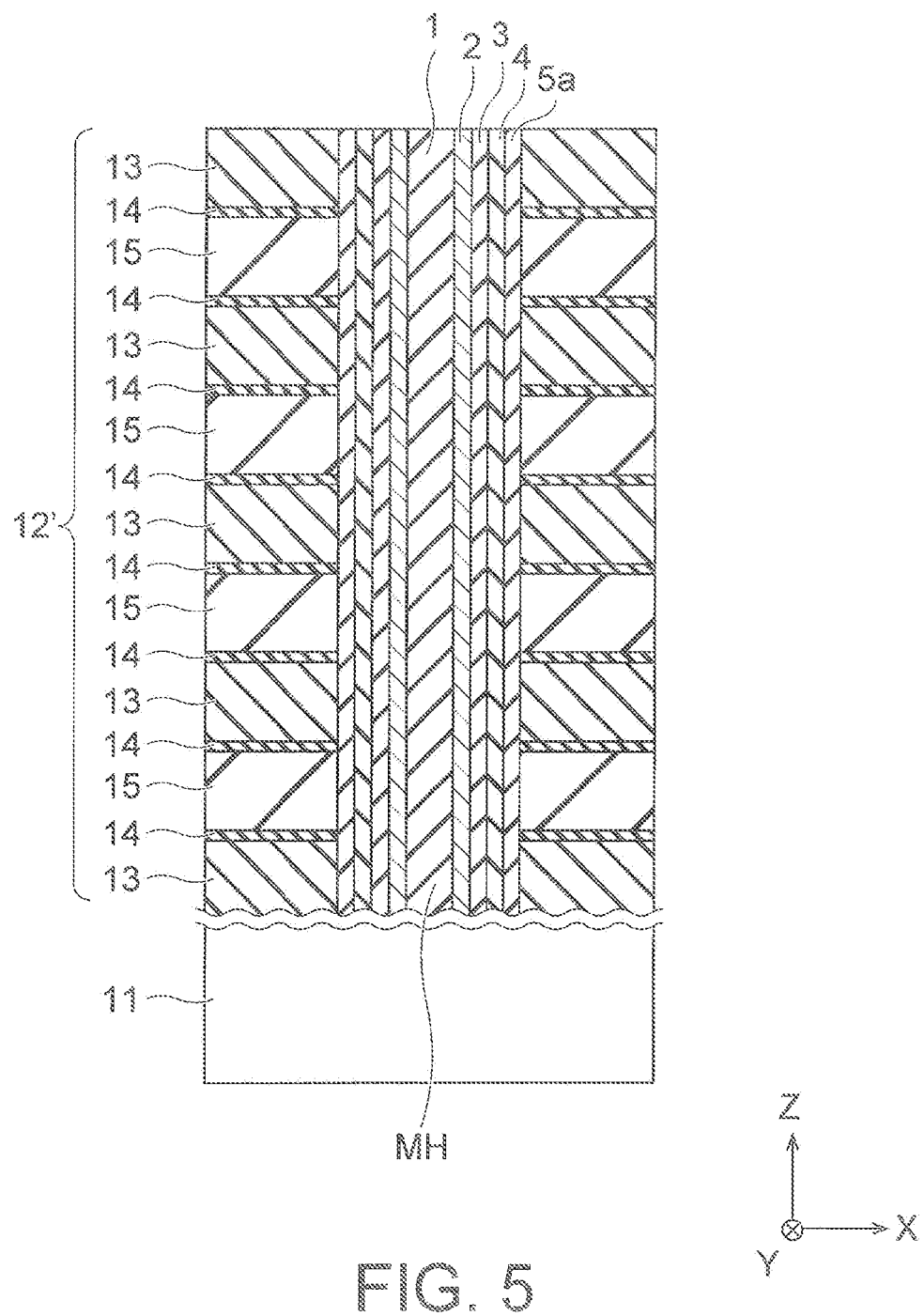

Next, the insulator 5a, the charge storage layer 4, the tunnel insulator 3, the channel semiconductor layer 2, and the core insulator 1 are formed in the stated order on an entire surface of the substrate 11 (FIG. 5). As a result, the insulator 5a, the charge storage layer 4, the tunnel insulator 3, the channel semiconductor layer 2, and the core insulator 1 are formed in the stated order on a side face of the stacked film 12' inside of the memory hole MH.

Figure 6:
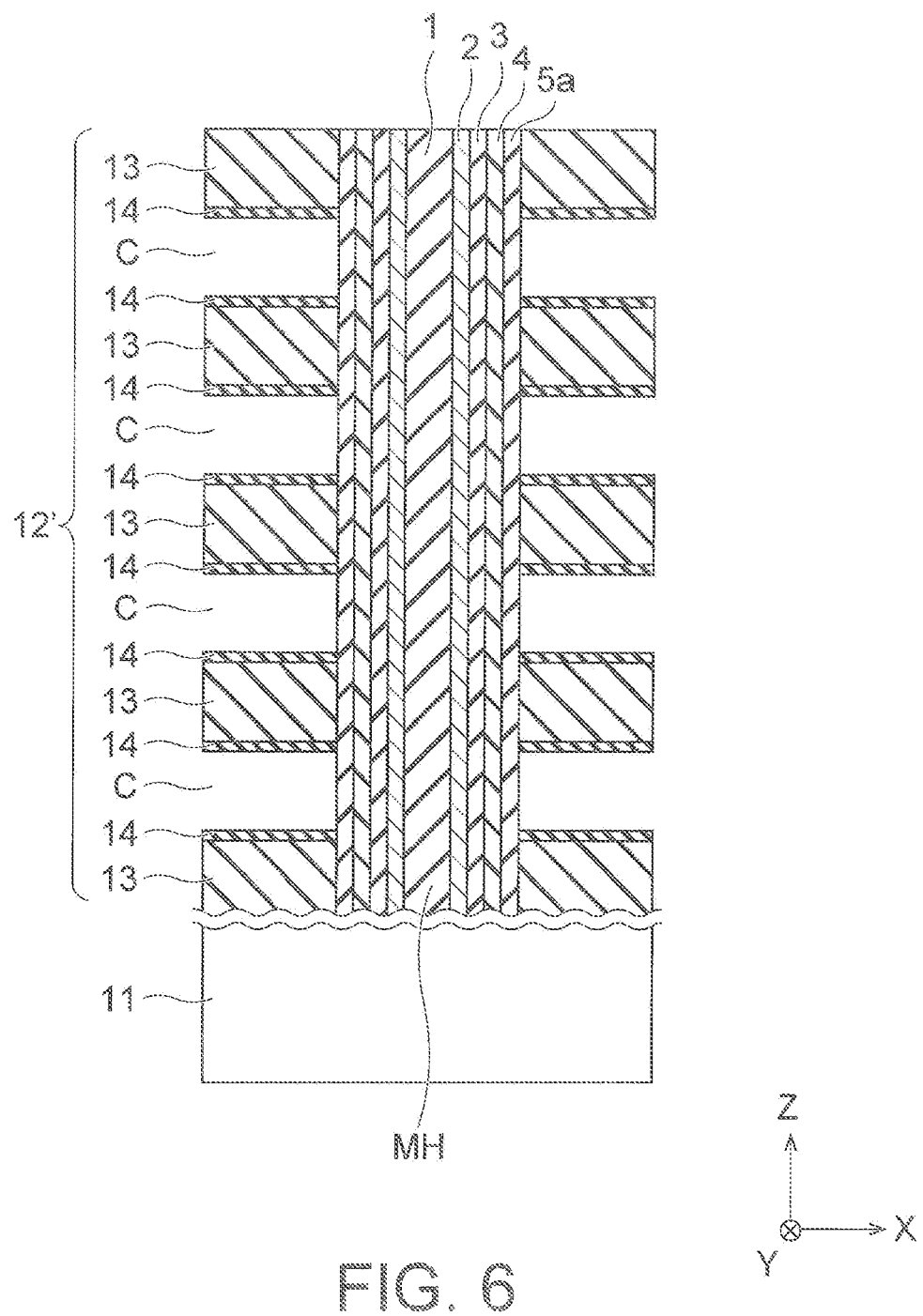

Next, slits (not illustrated) are formed in the stacked film 12' by lithography and RIE, and the sacrificial layers 15 are removed by wet etching through the slits (FIG. 6). As a result, a plurality of cavities C are formed between the insulating layers 13 in the stacked film 12'. At this time, the films 14 and the insulator 5a remain, and hence a lower face of each film 14, an upper face of each film 14, and the side face of the insulator 5a are exposed in each cavity C. This wet etching is performed using, for example, heated phosphoric acid.

After that, the insulators 5b, the barrier metal layers 6a, and the electrode material layers 6b are respectively formed in the stated order in these cavities C. As a result, the plurality of electrode layers 6 are respectively formed in these cavities C via the insulators 5b, and the stacked film 12 is formed on the substrate 11 (see FIG. 2). In this way, the sacrificial layers 15 are respectively replaced with the electrode layers 6 and the insulators 5b, and the stacked film 12 including the films 14 and the insulators 5b between the electrode layers 6 and the insulating layers 13 is formed.

After that, various insulators, line layers, plug layers, and the like are formed on the substrate 11. In this way, the semiconductor device of the present embodiment is manufactured.

Now, further details of the method of manufacturing the semiconductor device of the present embodiment are described continuously with reference to FIGS. 3 to 6.

In the process illustrated in FIG. 6, the sacrificial layers 15 are removed by a chemical solution (for example, heated phosphoric acid), so that the cavities C are formed between the insulating layers 13. At this time, if the insulating layers 13 are exposed to the chemical solution, there is a possibility that upper faces and lower faces of the insulating layers 13 are etched by the chemical solution. As a result, there are possibilities that the upper faces and the lower faces of the insulating layers 13 are inclined with respect to the XY plane and that the thicknesses of the insulating layers 13 are unequal. This leads to a possibility of variations in the threshold voltage of the memory cell transistor and variations in the resistances of the electrode layers 6.

However, the upper faces and the lower faces of the insulating layers 13 of the present embodiment are covered by the films 14. Because the films 14 of the present embodiment include C, the films 14 are resistant to the chemical solution such as heated phosphoric acid. Therefore, even when the films 14 are exposed to the chemical solution in the process illustrated in FIG. 6, the films 14 can remain. This makes it possible to prevent the exposure of the insulating layers 13 to the chemical solution and prevent the problem of the variations in the threshold voltage and the resistances. Such an effect can be obtained even in the case where the films 14 include Ge, Sn, Al, P, or As.

The thicknesses of the films 14 of the present embodiment are, for example, 1 to 5 nm. If the films 14 are thinner than 1 nm, there is a fear that the films 14 are exposed to the chemical solution and disappear. On the other hand, if the films 14 are thicker than 5 nm, there is a fear that the performance of the memory cell transistor is changed by an influence of the films 14. Therefore, it is desirable to set the thicknesses of the films 14 to 1 to 5 nm.

Moreover, the concentration of C included in the films 14 of the present embodiment is, for example, 5 to 50 atomic %. If this concentration is lower than 5 atomic %, there is a fear that the resistances of the films 14 to the chemical solution are insufficient. On the other hand, if this concentration is higher than 50 atomic %, there is a fear that insulation properties of the films 14 disappear or are insufficient. Therefore, it is desirable to set the concentration of C included in the films 14 to 5 to 50 atomic %. This also applies to the case where the films 14 include Ge, Sn, Al, P, or As.

As described above, the semiconductor device of the present embodiment includes the films 14 between the electrode layers 6 and the insulating layers 13 that are adjacent to each other in the Z direction, the films 14 including C, Ge, Sn, Al, P, or As. Therefore, the present embodiment makes it possible to favorably form insulating materials related to the stacked film 12, such as the insulating layers 13 in the stacked film 12. For example, the present embodiment makes it possible to prevent the insulating layers 13 from being etched by the chemical solution when the sacrificial layers 15 to be replaced with the electrode layers 6 are removed by the chemical solution.

Hereafter, different features of second to fifth embodiments from the first embodiment are mainly described, and description of features thereof common to the first embodiment is omitted as appropriate.

Second Embodiment

Figure 7:
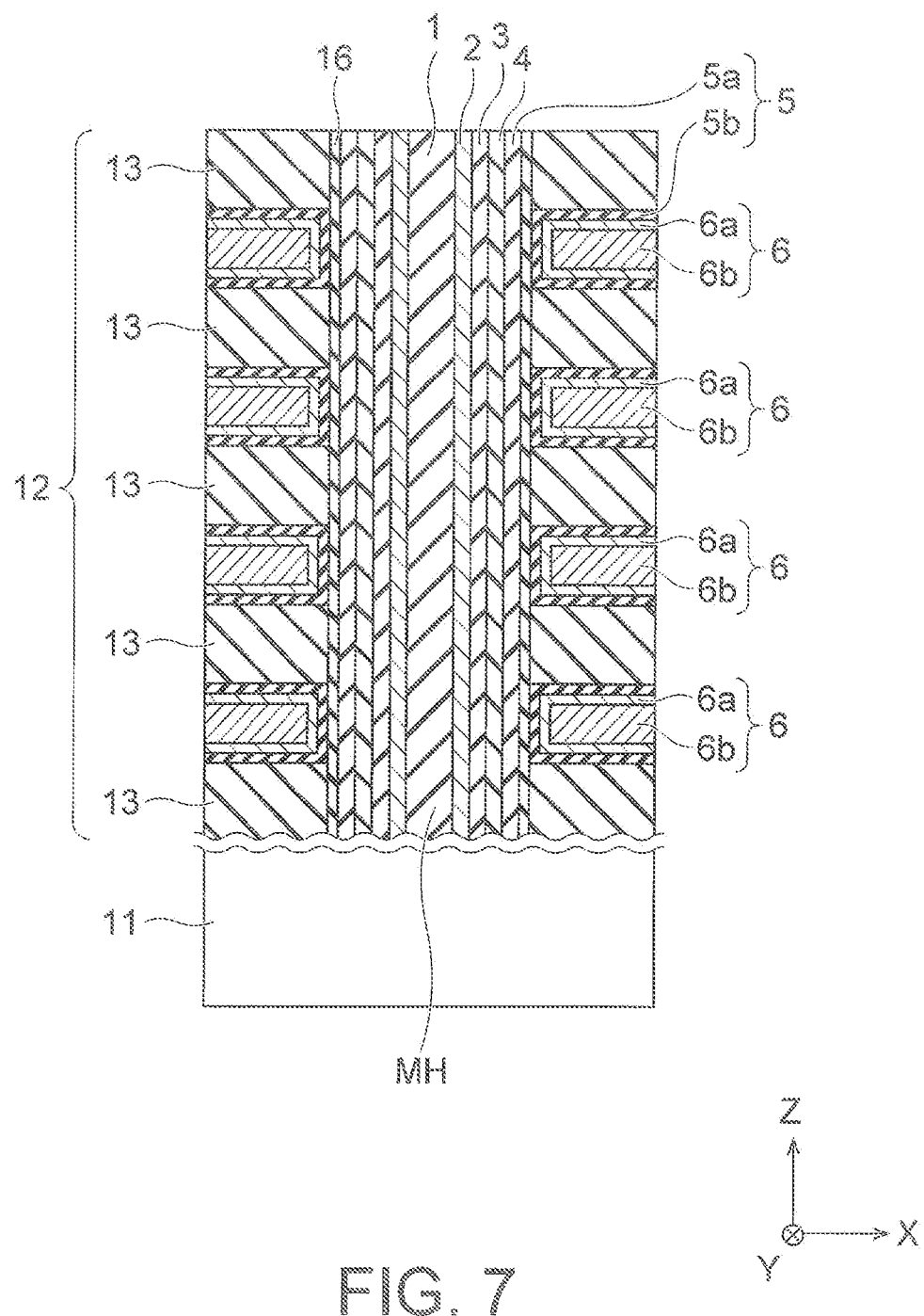
FIG. 7 is a cross-sectional view illustrating a structure of a semiconductor device of a second embodiment.

FIG. 7 is a cross-sectional view illustrating a structure of a semiconductor device of the second embodiment.

The semiconductor device (FIG. 7) of the present embodiment has a structure in which the plurality of films 14 in the semiconductor device (FIG. 2) of the first embodiment are replaced with a film 16. The film 16, the insulator 5a, the charge storage layer 4, the tunnel insulator 3, the channel semiconductor layer 2, and the core insulator 1 of the present embodiment are formed in the stated order on the side face of the stacked film 12 inside of the memory hole MH. Specifically, the film 16 of the present embodiment is continuously formed on the side faces of the plurality of electrode layers 6 and the side faces of the plurality of insulating layers 13. The film 16 of the present embodiment is formed on the side face of each electrode layer 6 via each insulator 5b. The film 16 is an example of the first film.

Similarly to the films 14 of the first embodiment, the film 16 of the present embodiment includes C, Ge, Sn, Al, P, or As. In the case where the film 16 includes C, the film 16 is, for example, an SiCN film, an SiOC film, or an SiOCN film. Moreover, in the case where the film 16 includes another element, the film 16 is, for example, an SiGe film, an SiGeN film, or an SiBN film. The film 16 may include, for example, Si and at least any one of C, Ge, Sn, Al, P, and As. The thickness of the film 16 is, for example, 1 to 7 nm. Moreover, the concentration of C, Ge, Sn, Al, P, or As included in the film 16 is, for example, 1 to 10 atomic %.

FIGS. 8 to 11 are cross-sectional views illustrating a method of manufacturing the semiconductor device of the second embodiment.

Figure 8:
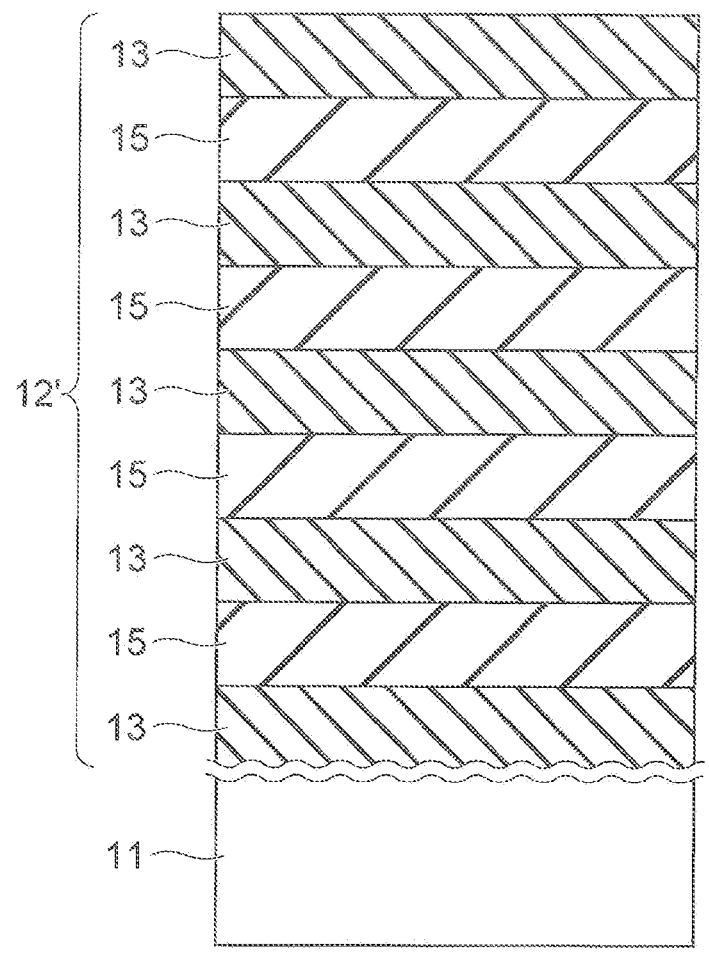
FIGS. 8 to 11 are cross-sectional views illustrating a method of manufacturing the semiconductor device of the second embodiment.
Figure 9:
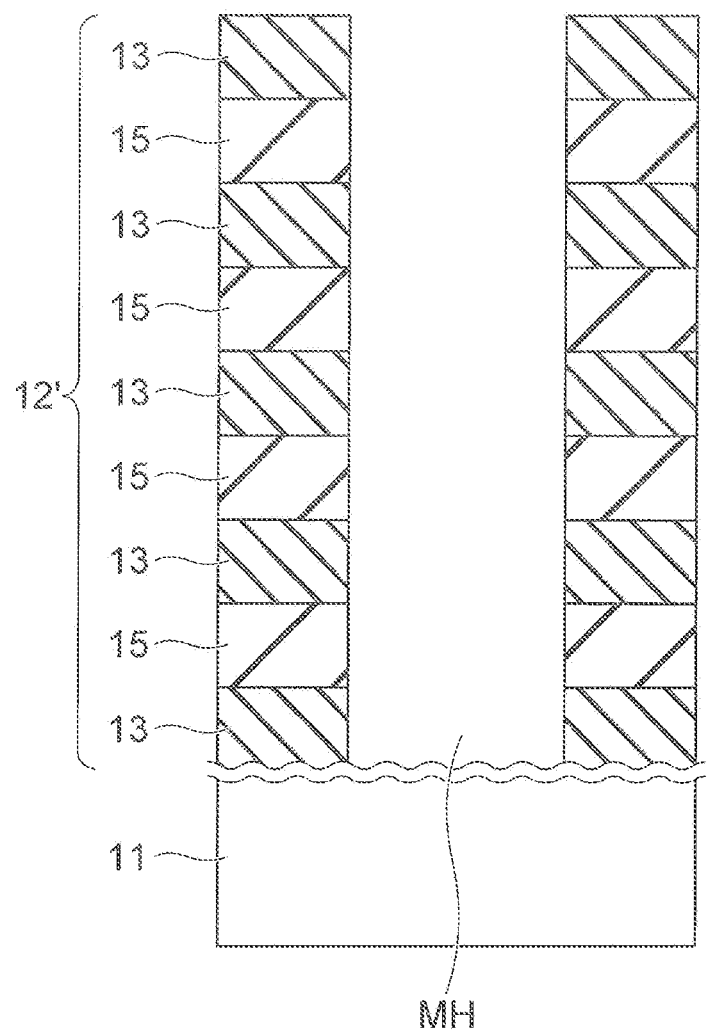

First, the stacked film 12' is formed on the substrate 11 (FIG. 8). The stacked film 12' is formed by alternately forming the plurality of insulating layers 13 and the plurality of sacrificial layers 15 on the substrate 11. Then, the memory hole MH is formed in the stacked film 12' by lithography and RIE (FIG. 9).

Figure 10:
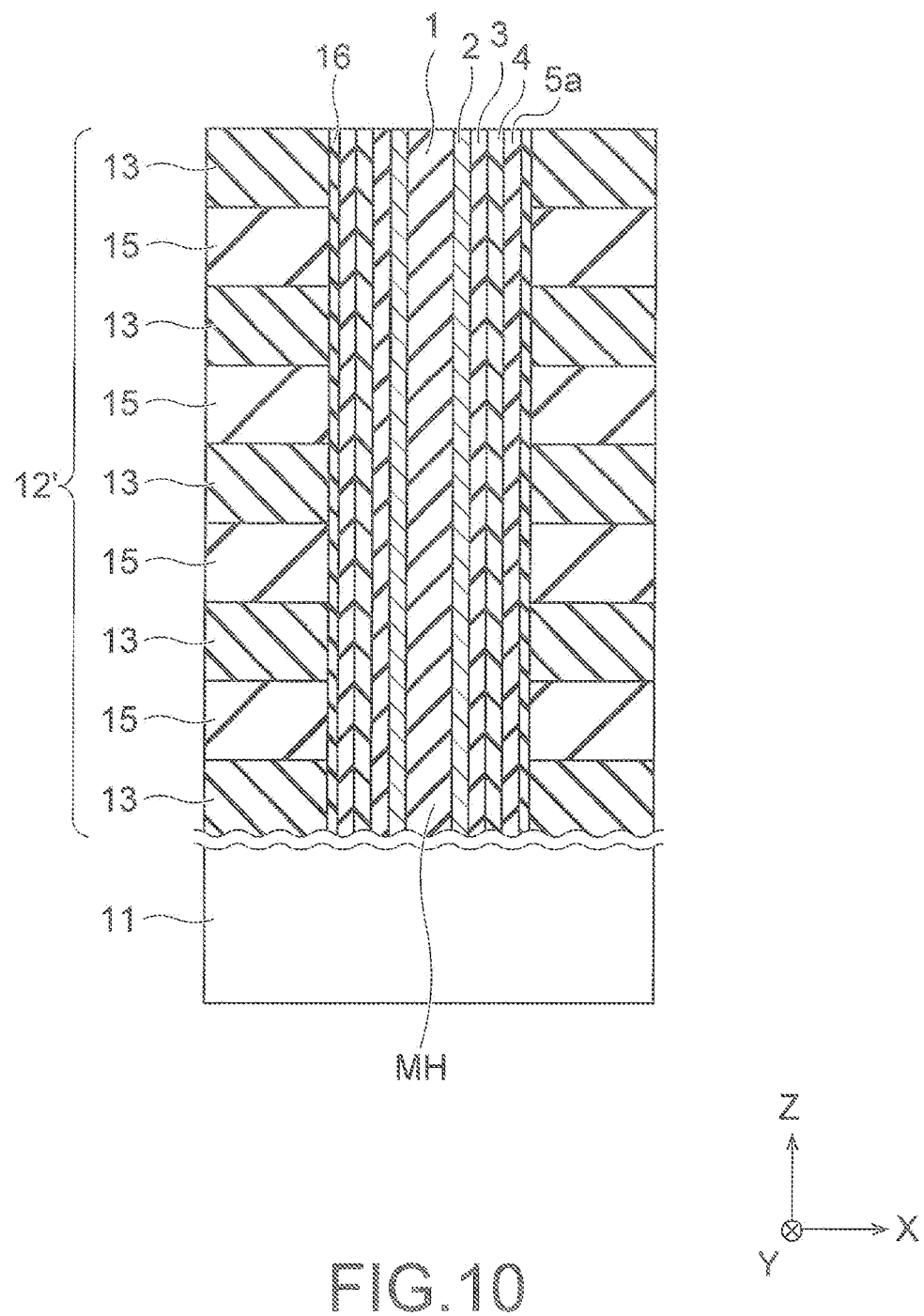

Next, the film 16, the insulator 5a, the charge storage layer 4, the tunnel insulator 3, the channel semiconductor layer 2, and the core insulator 1 are formed in the stated order on the entire surface of the substrate 11 (FIG. 10). As a result, the film 16, the insulator 5a, the charge storage layer 4, the tunnel insulator 3, the channel semiconductor layer 2, and the core insulator 1 are formed in the stated order on the side face of the stacked film 12' inside of the memory hole MH.

The film 16 is, for example, an SiCN film, and is formed by CVD using $(CH_3)_3SiH$ gas and $NH_3$ gas. The concentration of C included in the film 16 is set to, for example, 1 to 10 atomic %. The film 16 of the present embodiment is continuously formed on the side faces of the plurality of electrode layers 6 and the side faces of the plurality of insulating layers 13.

Figure 11:
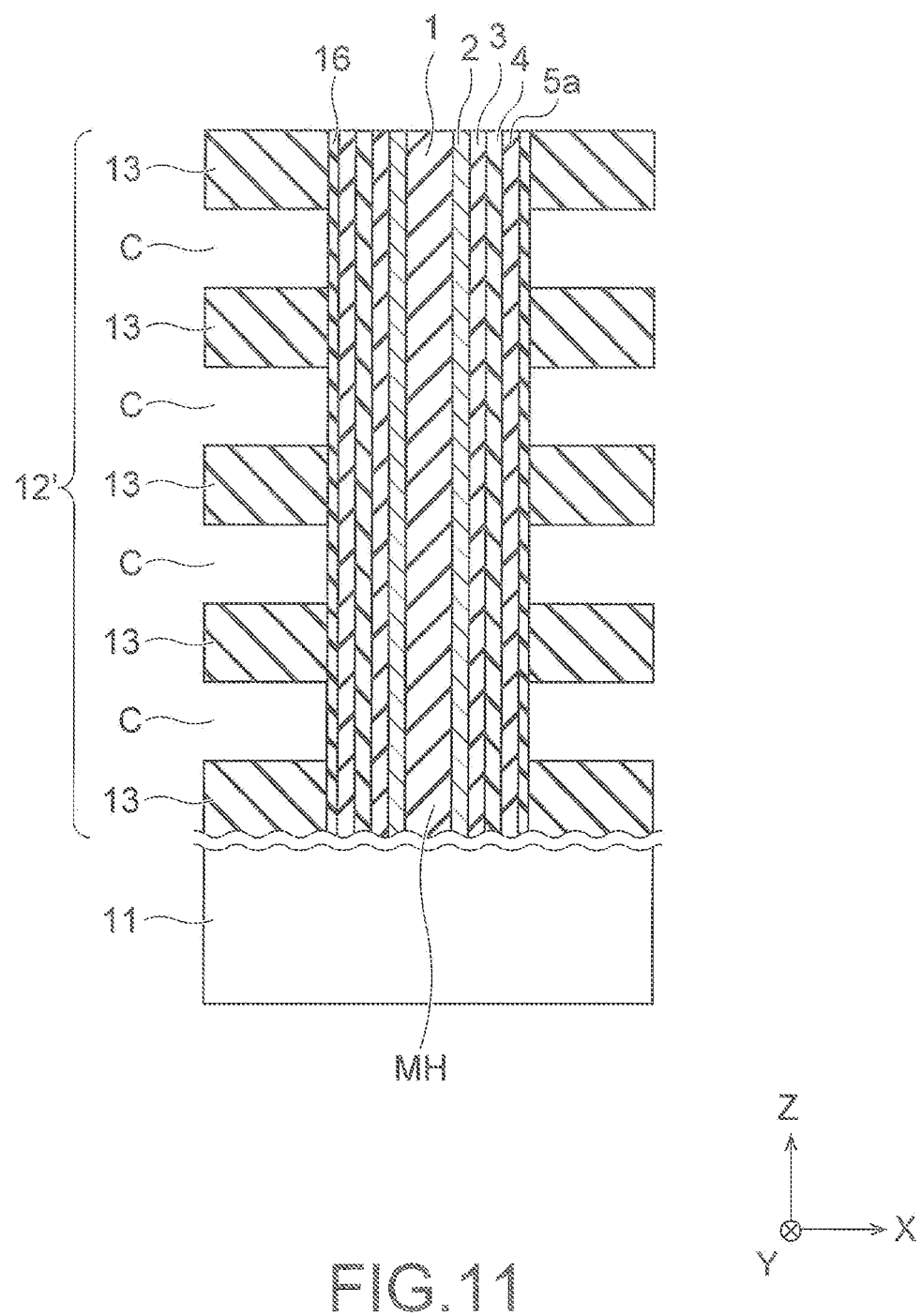

Next, slits are formed in the stacked film 12' by lithography and RIE, and the sacrificial layers 15 are removed by wet etching through the slits (FIG. 11). As a result, the plurality of cavities C are formed between the insulating layers 13 in the stacked film 12'. At this time, the film 16 remains, and hence a side face of the film 16 is exposed in each cavity C. This wet etching is performed using, for example, heated phosphoric acid. At this time, in order to enhance the performance of the memory cell, the film 16 may be oxidized by radical oxidation through the cavities C.

After that, the insulators 5b, the barrier metal layers 6a, and the electrode material layers 6b are respectively formed in the stated order in these cavities C. As a result, the plurality of electrode layers 6 are respectively formed in these cavities C via the insulators 5b, and the stacked film 12 is formed on the substrate 11 (see FIG. 7). In this way, the sacrificial layers 15 are respectively replaced with the electrode layers 6 and the insulators 5b, and the film 16 is sandwiched between the insulator 5a and the insulators 5b.

After that, various insulators, line layers, plug layers, and the like are formed on the substrate 11. In this way, the semiconductor device of the present embodiment is manufactured.

Now, further details of the method of manufacturing the semiconductor device of the present embodiment are described continuously with reference to FIGS. 8 to 11.

In the process illustrated in FIG. 11, the sacrificial layers 15 are removed by a chemical solution (for example, heated phosphoric acid), so that the cavities C are formed between the insulating layers 13. At this time, if the insulator 5a is exposed to the chemical solution, there is a possibility that the side face of the insulator 5a is etched by the chemical solution. As a result, there are possibilities that the side face of the insulator 5a is recessed and that the thickness of the insulator 5a is unequal. This leads to a possibility of variations in the operating voltage and the charge retention characteristics of the memory cell transistor.

However, the side face of the insulator 5a of the present embodiment is covered by the film 16. Because the film 16 of the present embodiment includes C, the film 16 is resistant to the chemical solution such as heated phosphoric acid. Therefore, even when the film 16 is exposed to the chemical solution in the process illustrated in FIG. 11, the film 16 can remain. This makes it possible to prevent the exposure of the insulator 5a to the chemical solution and prevent the problem of the variations in the operating voltage and the charge retention characteristics. Such an effect can be obtained even in the case where the film 16 includes Ge, Sn, Al, P, or As.

The thickness of the film 16 of the present embodiment is, for example, 1 to 7 nm. If the film 16 is thinner than 1 nm, there is a fear that the film 16 is exposed to the chemical solution and disappears. On the other hand, if the film 16 is thicker than 7 nm, there is a fear that the performance of the memory cell transistor is changed by an influence of the film 16. Therefore, it is desirable to set the thickness of the film 16 to 1 to 7 nm.

Moreover, the concentration of C included in the film 16 of the present embodiment is, for example, 1 to 10 atomic %. If this concentration is lower than 1 atomic %, there is a fear that the resistance of the film 16 to the chemical solution is insufficient. On the other hand, if this concentration is higher than 10 atomic %, there is a fear that insulation properties of the film 16 disappear or are insufficient. Therefore, it is desirable to set the concentration of C included in the film 16 to 1 to 10 atomic %. This also applies to the case where the film 16 includes Ge, Sn, Al, P, or As.

As described above, the semiconductor device of the present embodiment includes the film 16 between the insulator 5a and the insulators 5b, the film 16 including C, Ge, Sn, Al, P, or As. Therefore, the present embodiment makes it possible to favorably form insulating materials related to the stacked film 12, such as the insulator 5a near the stacked film 12. For example, the present embodiment makes it possible to prevent the insulator 5a from being etched by the chemical solution when the sacrificial layers 15 to be replaced with the electrode layers 6 are removed by the chemical solution.

Third Embodiment

Figure 12:
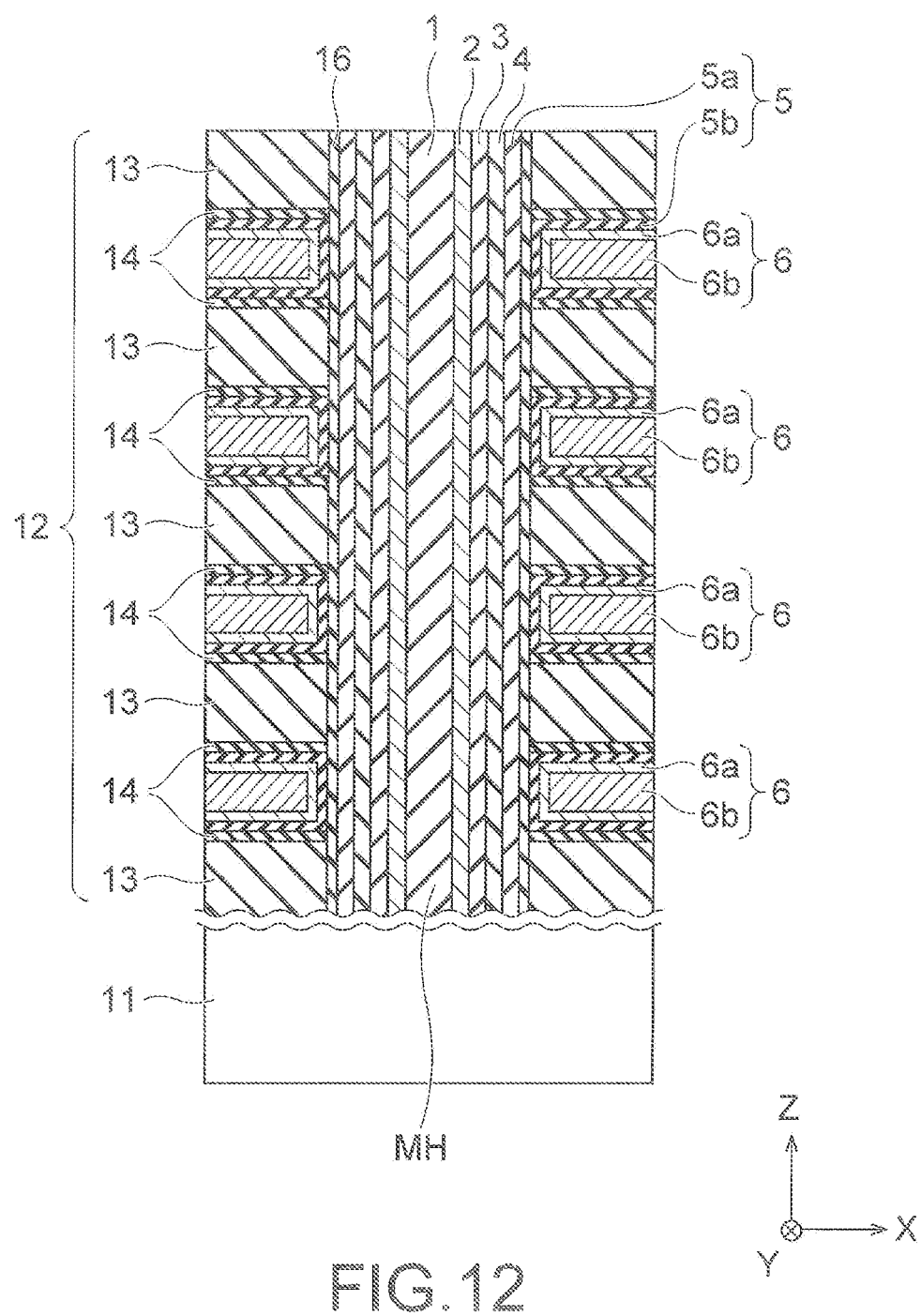
FIG. 12 is a cross-sectional view illustrating a structure of a semiconductor device of a third embodiment.

FIG. 12 is a cross-sectional view illustrating a structure of a semiconductor device of the third embodiment.

The semiconductor device (FIG. 12) of the present embodiment includes the film 16 (FIG. 7) of the second embodiment in addition to the constituent elements of the semiconductor device (FIG. 2) of the first embodiment. That is, the semiconductor device of the present embodiment includes the plurality of films 14 and the film 16. Details of the films 14 and the film 16 of the present embodiment are the same as those of the films 14 of the first embodiment and the film 16 of the second embodiment.

FIGS. 13 to 16 are cross-sectional views illustrating a method of manufacturing the semiconductor device of the third embodiment.

Figure 13:
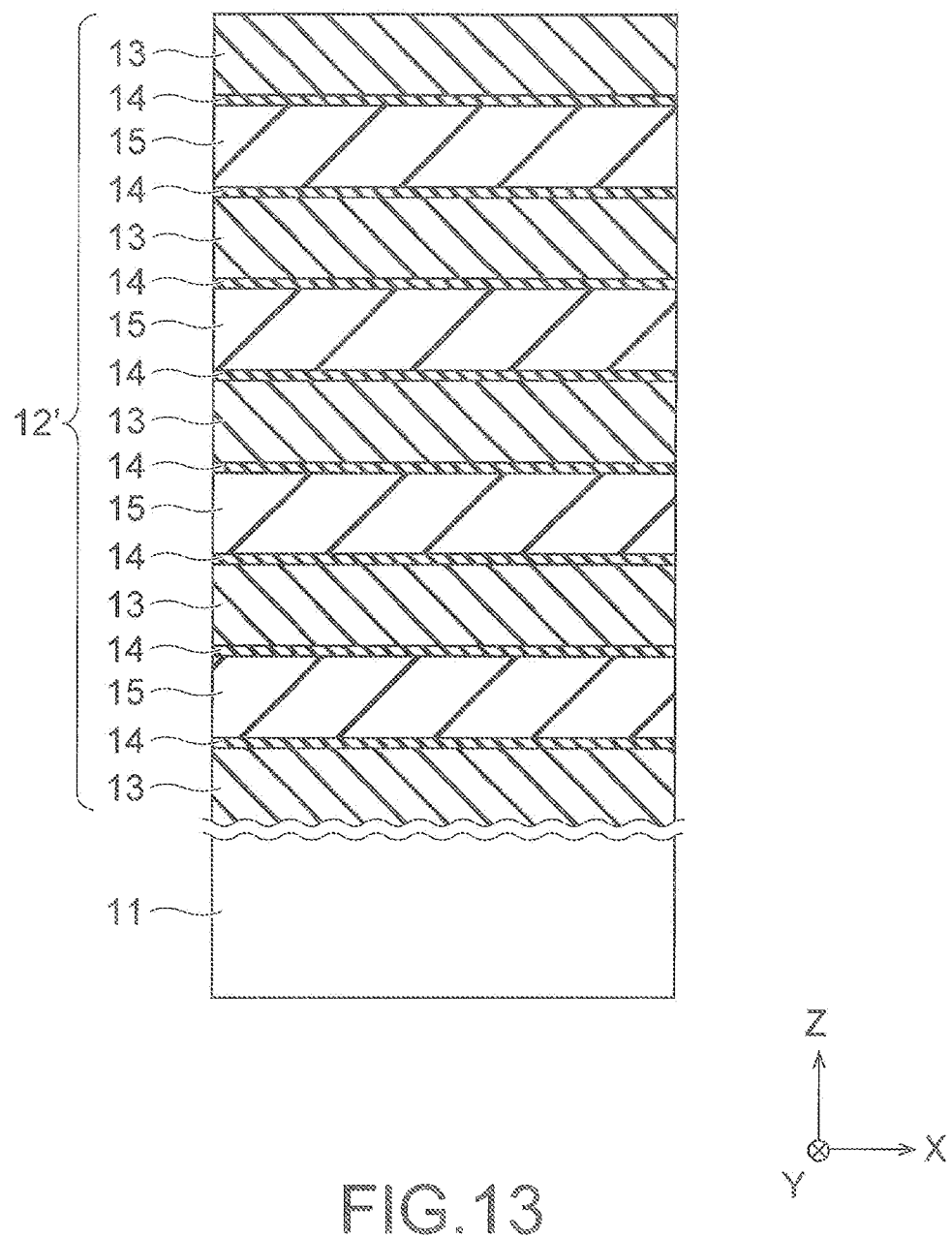
FIGS. 13 to 16 are cross-sectional views illustrating a method of manufacturing the semiconductor device of the third embodiment.
Figure 14:
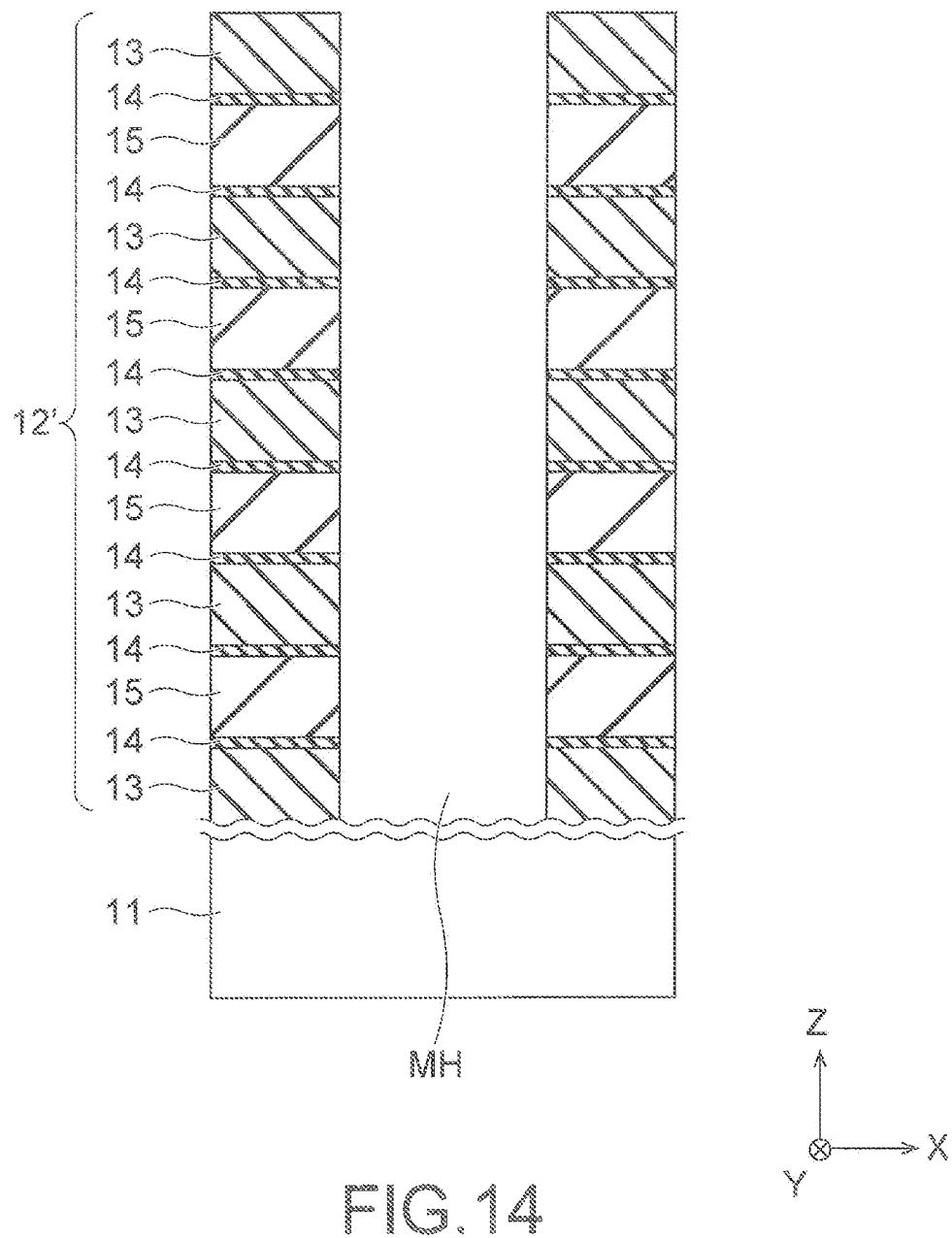

First, the stacked film 12' is formed on the substrate 11 (FIG. 13). The stacked film 12' is formed by alternately forming the plurality of insulating layers 13 and the plurality of sacrificial layers 15 on the substrate 11. At this time, the films 14 are respectively formed between the insulating layers 13 and the sacrificial layers 15. Then, the memory hole MH is formed in the stacked film 12' by lithography and RIE (FIG. 14).

Figure 15:
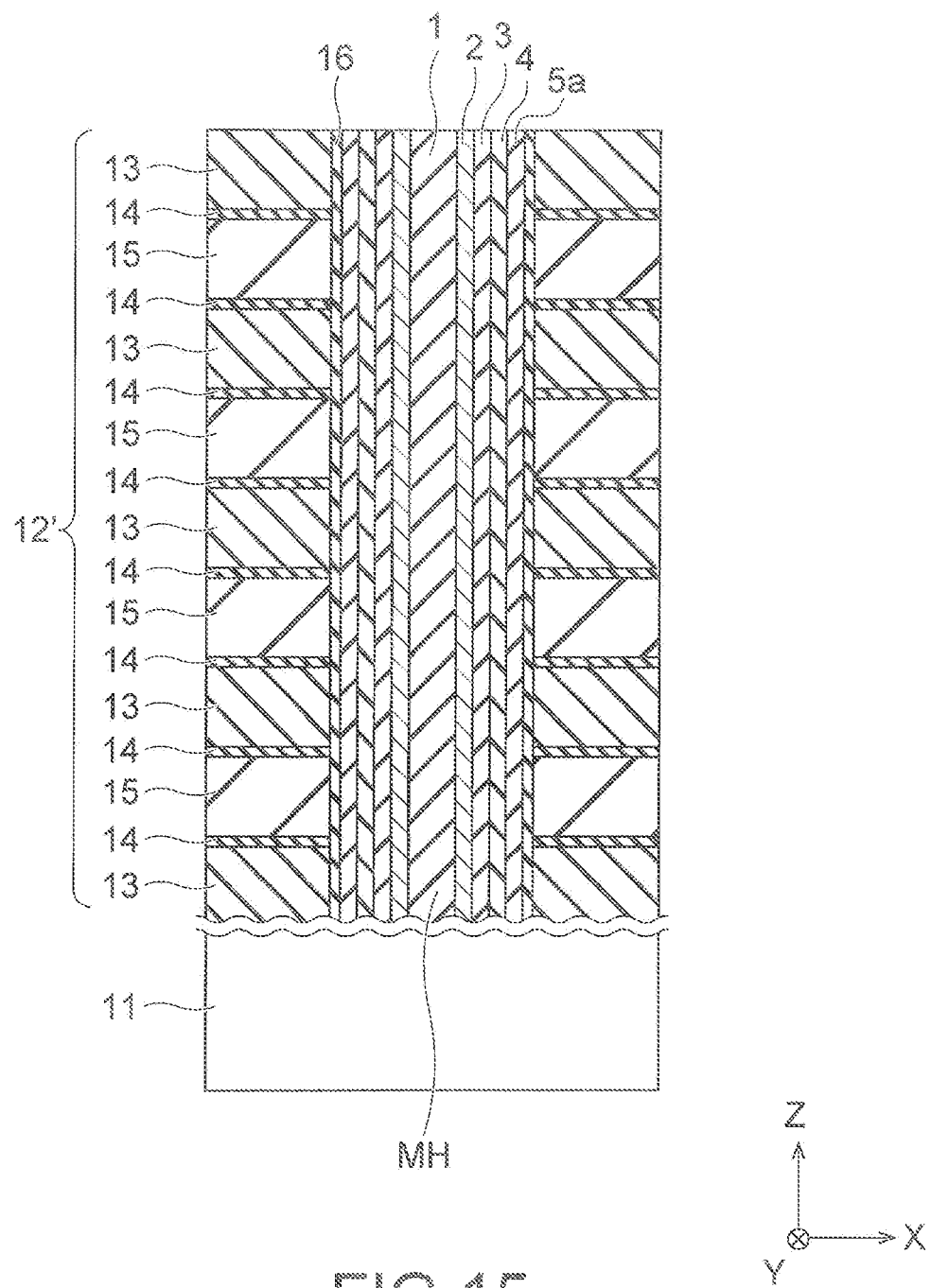

Next, the film 16, the insulator 5a, the charge storage layer 4, the tunnel insulator 3, the channel semiconductor layer 2, and the core insulator 1 are formed in the stated order on the entire surface of the substrate 11 (FIG. 15). As a result, the film 16, the insulator 5a, the charge storage layer 4, the tunnel insulator 3, the channel semiconductor layer 2, and the core insulator 1 are formed in the stated order on the side face of the stacked film 12' inside of the memory hole MH.

Figure 16:
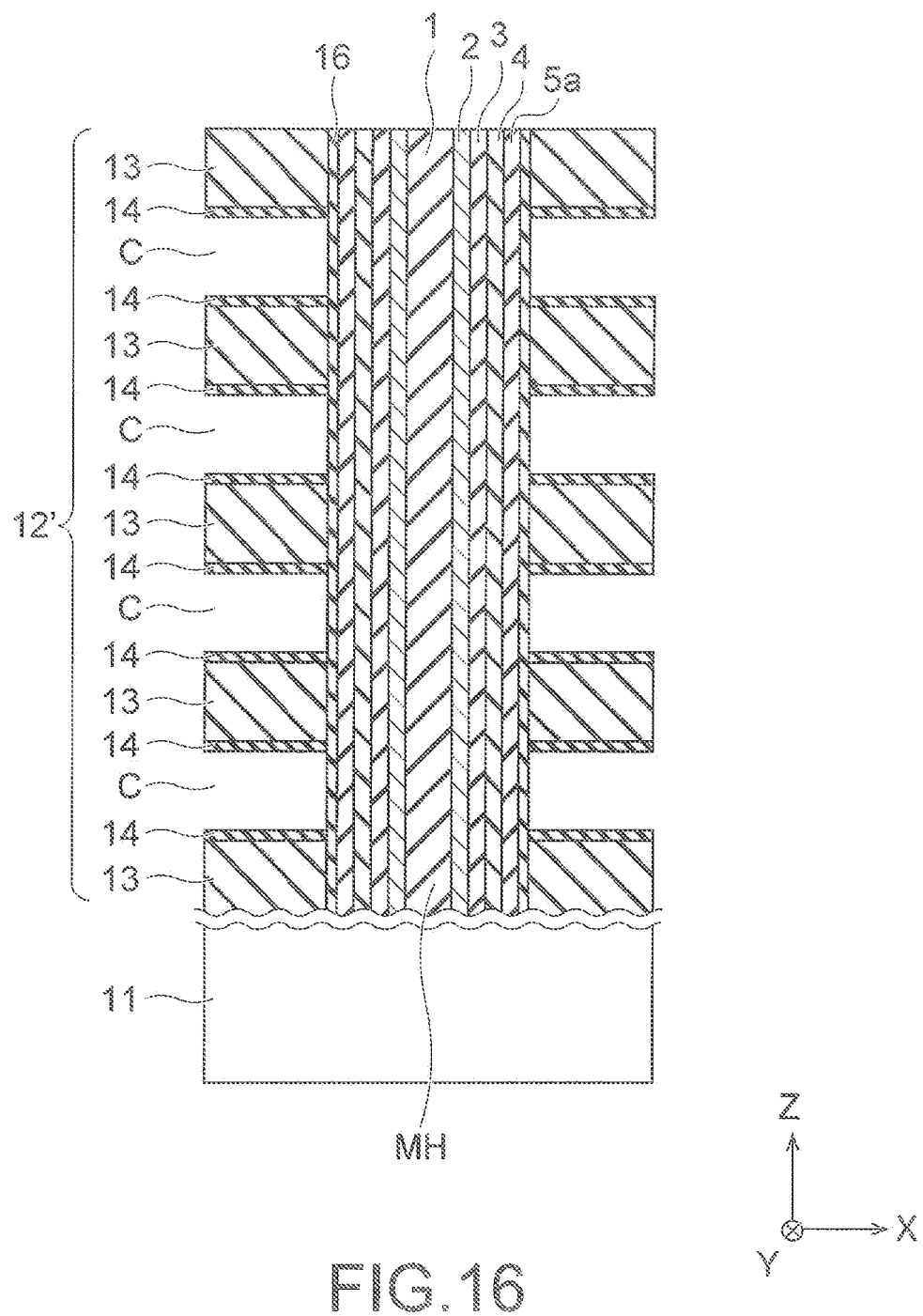

Next, slits are formed in the stacked film 12' by lithography and RIE, and the sacrificial layers 15 are removed by wet etching through the slits (FIG. 16). As a result, the plurality of cavities C are formed between the insulating layers 13 in the stacked film 12'. At this time, the films 14 and the film 16 remain, and hence the lower face of each film 14, the upper face of each film 14, and the side face of the film 16 are exposed in each cavity C. This wet etching is performed using, for example, heated phosphoric acid.

After that, the insulators 5b, the barrier metal layers 6a, and the electrode material layers 6b are respectively formed in the stated order in these cavities C. As a result, the plurality of electrode layers 6 are respectively formed in these cavities C via the insulators 5b, and the stacked film 12 is formed on the substrate 11 (see FIG. 12). In this way, the sacrificial layers 15 are respectively replaced with the electrode layers 6 and the insulators 5b, the stacked film 12 including the films 14 and the insulators 5b between the electrode layers 6 and the insulating layers 13 is formed, and the film 16 is sandwiched between the insulator 5a and the insulators 5b.

After that, various insulators, line layers, plug layers, and the like are formed on the substrate 11. In this way, the semiconductor device of the present embodiment is manufactured.

Now, further details of the method of manufacturing the semiconductor device of the present embodiment are described continuously with reference to FIGS. 13 to 16.

In the process illustrated in FIG. 16, the sacrificial layers 15 are removed by a chemical solution (for example, heated phosphoric acid), so that the cavities C are formed between the insulating layers 13. At this time, there is a possibility that a problem similar to that in the first embodiment occurs in the insulating layers 13, and there is a possibility that a problem similar to that in the second embodiment occurs in the insulator 5a. However, because the semiconductor device of the present embodiment includes the films 14 and the film 16, these problems can be prevented.

As described above, the semiconductor device of the present embodiment includes the films 14 between the electrode layers 6 and the insulating layers 13 that are adjacent to each other in the Z direction, the films 14 including C, Ge, Sn, Al, P, or As, and includes the film 16 between the insulator 5a and the insulators 5b, the film 16 including C, Ge, Sn, Al, P, or As. Therefore, the present embodiment makes it possible to favorably form insulating materials related to the stacked film 12, such as the insulating layers 13 in the stacked film 12 and the insulator 5a near the stacked film 12. For example, the present embodiment makes it possible to prevent the insulating layers 13 and the insulator 5a from being etched by the chemical solution when the sacrificial layers 15 to be replaced with the electrode layers 6 are removed by the chemical solution.

Fourth Embodiment

Figure 17:
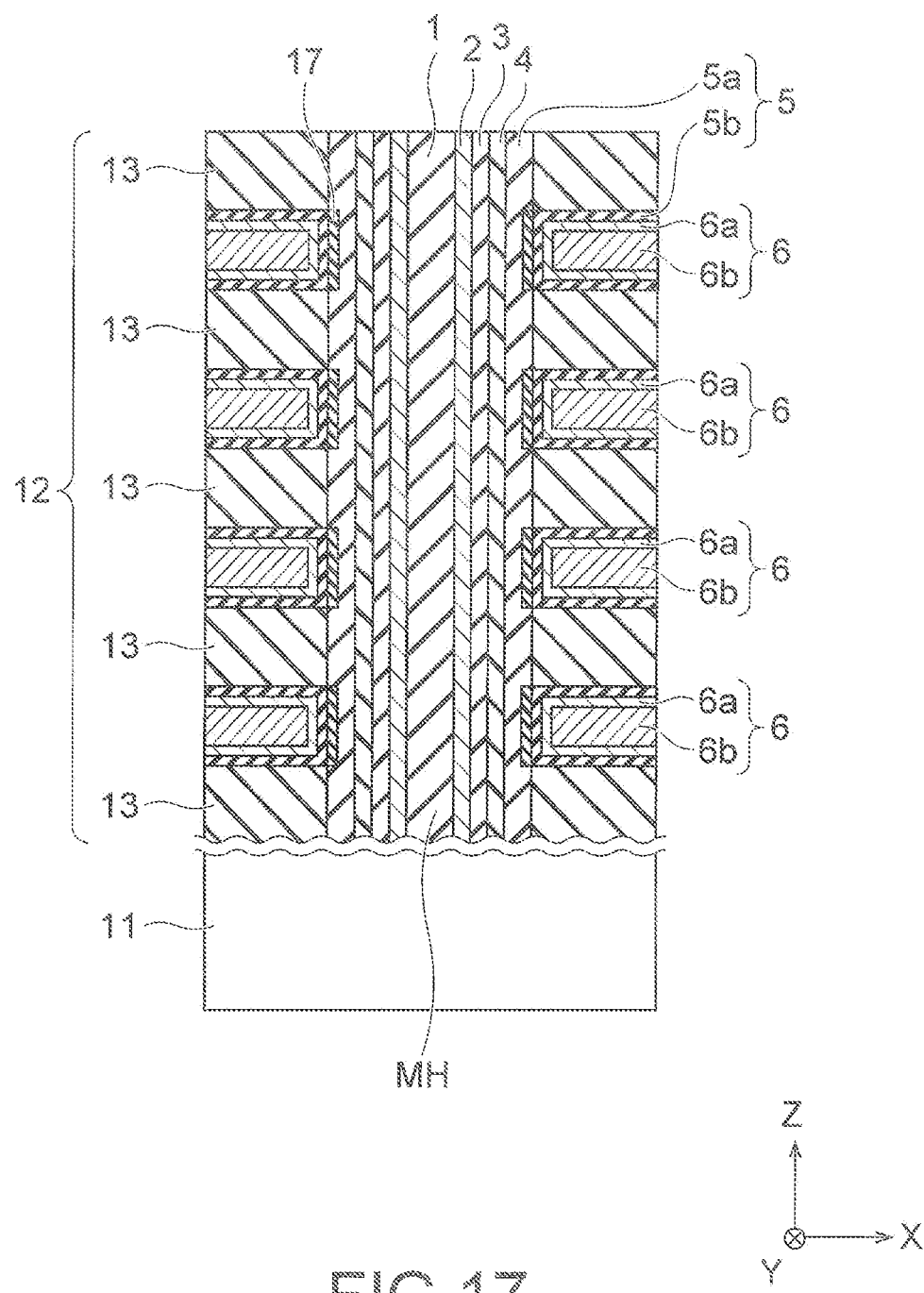
FIG. 17 is a cross-sectional view illustrating a structure of a semiconductor device of a fourth embodiment.

FIG. 17 is a cross-sectional view illustrating a structure of a semiconductor device of the fourth embodiment.

The semiconductor device (FIG. 17) of the present embodiment has a structure in which the plurality of films 14 of the semiconductor device (FIG. 2) of the first embodiment are replaced with a plurality of films 17. The plurality of films 17, the insulator 5a, the charge storage layer 4, the tunnel insulator 3, the channel semiconductor layer 2, and the core insulator 1 of the present embodiment are formed in the stated order on the side face of the stacked film 12 inside of the memory hole MH. Specifically, these films 17 are respectively formed on the side faces of the plurality of electrode layers 6, and are isolated from one another. Each film 17 of the present embodiment is formed on the side face of its corresponding electrode layer 6 via each insulator 5b. The films 17 are an example of the first film.

Similarly to the films 14 of the first embodiment, the films 17 of the present embodiment include C, Ge, Sn, Al, P, or As. In the case where the films 17 include C, the films 17 are, for example, SiCN films, SiOC films, or SiOCN films. Moreover, in the case where the films 17 include another element, the films 17 are, for example, SiGe films, SiGeN films, or SiBN films. The films 17 may include, for example, Si and at least any one of C, Ge, Sn, Al, P, and As. The thickness of each film 17 is, for example, 1 to 7 nm. Moreover, the concentration of C, Ge, Sn, Al, P, or As included in each film 17 is, for example, 1 to 10 atomic %.

FIGS. 18 to 21 are cross-sectional views illustrating a method of manufacturing the semiconductor device of the fourth embodiment.

Figure 18:
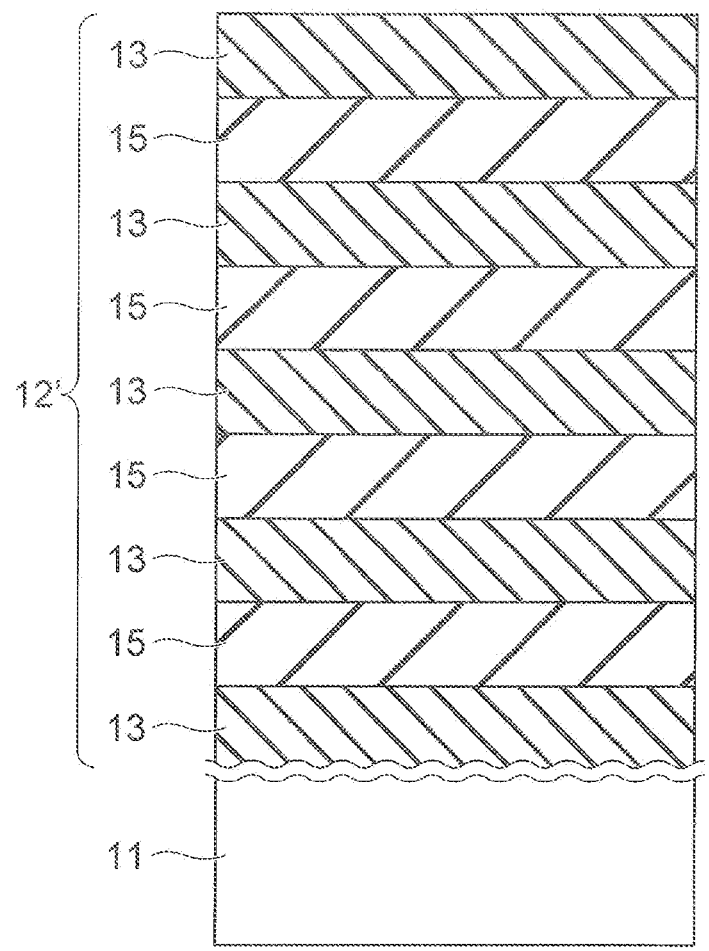
FIGS. 18 to 21 are cross-sectional views illustrating a method of manufacturing the semiconductor device of the fourth embodiment.
Figure 18:
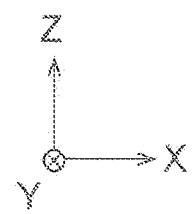
Figure 19:
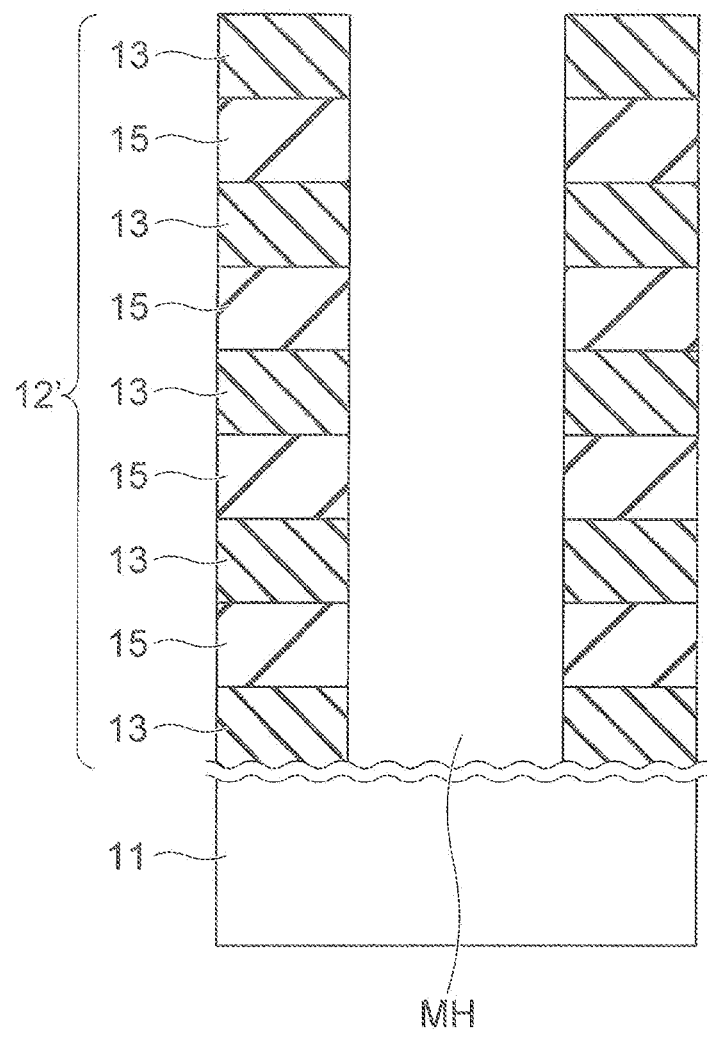

First, the stacked film 12' is formed on the substrate 11 (FIG. 18). The stacked film 12' is formed by alternately forming the plurality of insulating layers 13 and the plurality of sacrificial layers 15 on the substrate 11. Then, the memory hole MH is formed in the stacked film 12' by lithography and RIE (FIG. 19).

Figure 20:
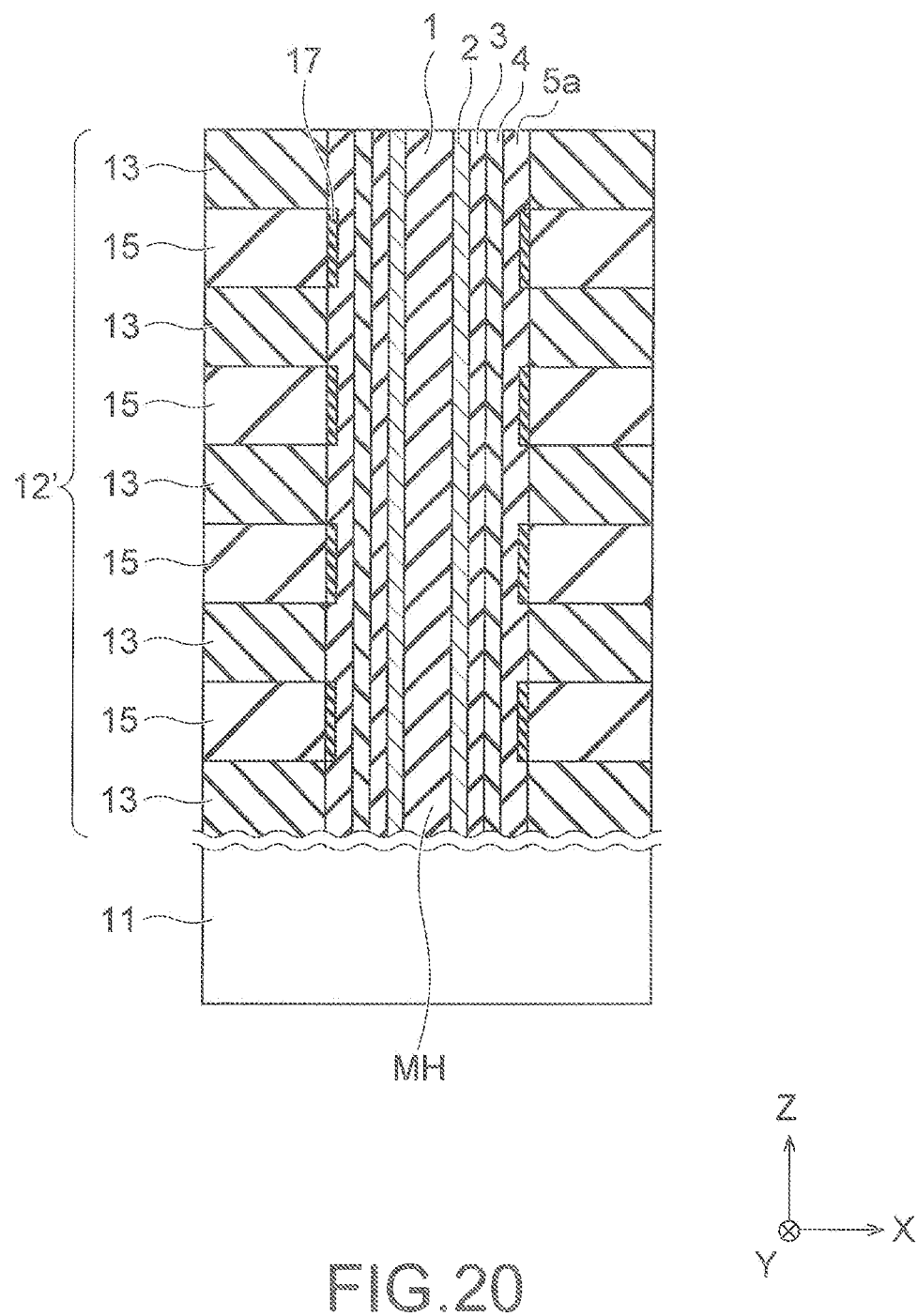

Next, the plurality of films 17 are selectively formed on side faces of the sacrificial layers 15, of the side faces of the insulating layers 13 and the side faces of the sacrificial layers 15 inside of the memory hole MH (FIG. 20). As a result, these films 17 are formed in a state isolated from one another. The films 17 are, for example, SiCN films, and are formed by CVD using $SiCl_4$ (tetrachlorosilane) gas and $(CH_3)NH_2$ (methylamine) gas. The concentration of C included in the films 17 is set to, for example, 1 to 10 atomic %.

Next, the insulator 5a, the charge storage layer 4, the tunnel insulator 3, the channel semiconductor layer 2, and the core insulator 1 are formed in the stated order on the entire surface of the substrate 11 (FIG. 20). As a result, the insulator 5a, the charge storage layer 4, the tunnel insulator 3, the channel semiconductor layer 2, and the core insulator 1 are formed in the stated order on the side face of the stacked film 12' inside of the memory hole MH, via the films 17.

Figure 21:
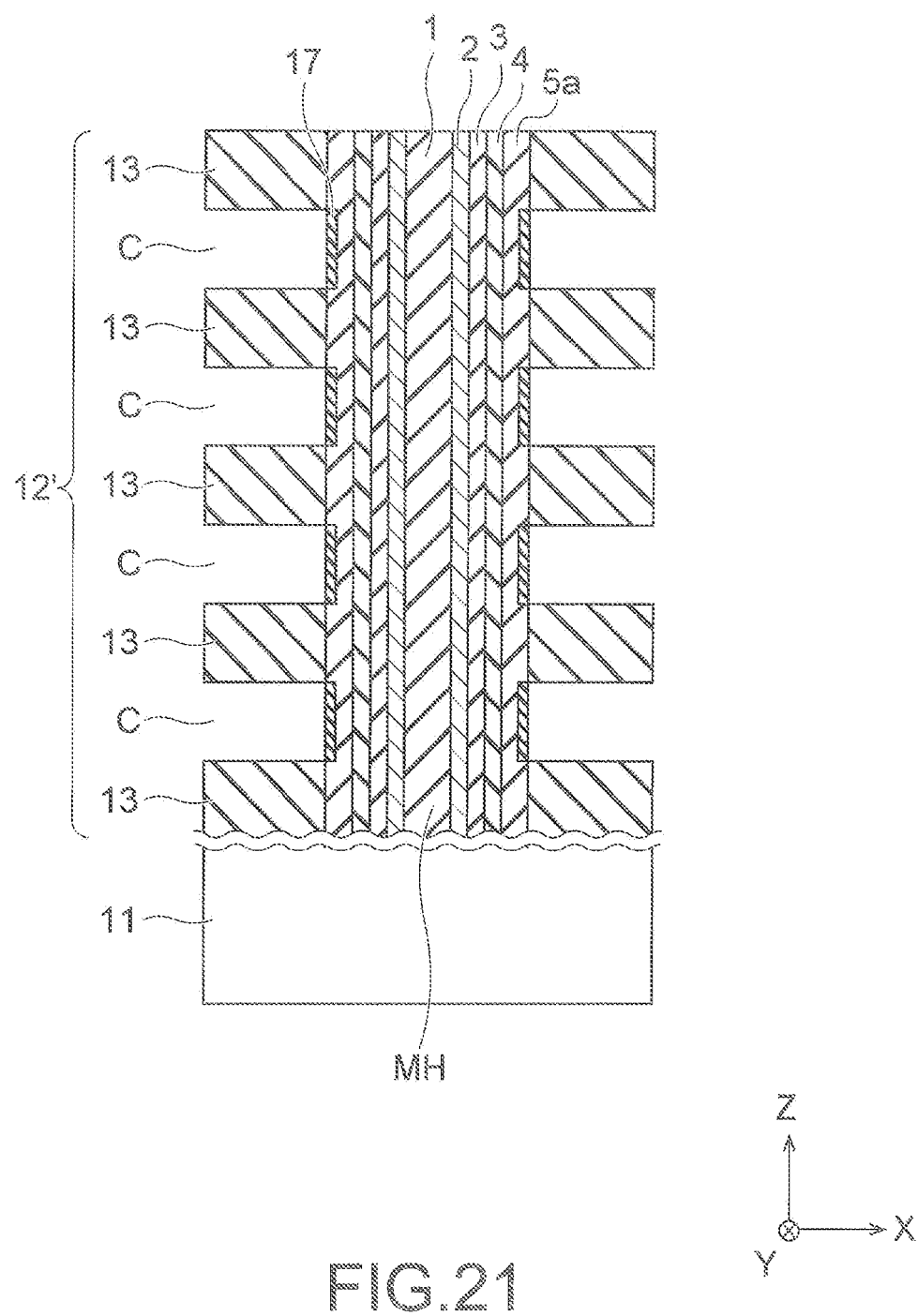

Next, slits are formed in the stacked film 12' by lithography and RIE, and the sacrificial layers 15 are removed by wet etching through the slits (FIG. 21). As a result, the plurality of cavities C are formed between the insulating layers 13 in the stacked film 12'. At this time, the films 17 remain, and hence a side face of each film 17 is exposed in each cavity C. This wet etching is performed using, for example, heated phosphoric acid. At this time, in order to enhance the performance of the memory cell, the films 17 may be oxidized by radical oxidation through the cavities C.

After that, the insulators 5b, the barrier metal layers 6a, and the electrode material layers 6b are respectively formed in the stated order in these cavities C. As a result, the plurality of electrode layers 6 are respectively formed in these cavities C via the insulators 5b, and the stacked film 12 is formed on the substrate 11 (see FIG. 17). In this way, the sacrificial layers 15 are respectively replaced with the electrode layers 6 and the insulators 5b, and the films 17 are sandwiched between the insulator 5a and the insulators 5b.

After that, various insulators, line layers, plug layers, and the like are formed on the substrate 11. In this way, the semiconductor device of the present embodiment is manufactured.

Now, further details of the method of manufacturing the semiconductor device of the present embodiment are described continuously with reference to FIGS. 18 to 21.

In the process illustrated in FIG. 21, the sacrificial layers 15 are removed by a chemical solution (for example, heated phosphoric acid), so that the cavities C are formed between the insulating layers 13. At this time, if the insulator 5a is exposed to the chemical solution, there is a possibility that the side face of the insulator 5a is etched by the chemical solution. As a result, there are possibilities that the side face of the insulator 5a is recessed and that the thickness of the insulator 5a is unequal. This leads to a possibility of variations in the operating voltage and the charge retention characteristics of the memory cell transistor.

However, the side face of the insulator 5a of the present embodiment is covered by the films 17. Because the films 17 of the present embodiment include C, the films 17 are resistant to the chemical solution such as heated phosphoric acid. Therefore, even when the films 17 are exposed to the chemical solution in the process illustrated in FIG. 21, the films 17 can remain. This makes it possible to prevent the exposure of the insulator 5a to the chemical solution and prevent the problem of the variations in the operating voltage and the charge retention characteristics. Such an effect can be obtained even in the case where the films 17 include Ge, Sn, Al, P, or As.

The thicknesses of the films 17 of the present embodiment are, for example, 1 to 7 nm. If the films 17 are thinner than 1 nm, there is a fear that the films 17 are exposed to the chemical solution and disappear. On the other hand, if the films 17 are thicker than 7 nm, there is a fear that the performance of the memory cell transistor is changed by an influence of the films 17. Therefore, it is desirable to set the thicknesses of the films 17 to 1 to 7 nm.

Moreover, the concentration of C included in the films 17 of the present embodiment is, for example, 1 to 10 atomic %. If this concentration is lower than 1 atomic %, there is a fear that the resistances of the films 17 to the chemical solution are insufficient. On the other hand, if this concentration is higher than 10 atomic %, there is a fear that insulation properties of the films 17 disappear or are insufficient. Therefore, it is desirable to set the concentration of C included in the films 17 to 1 to 10 atomic %. This also applies to the case where the films 17 include Ge, Sn, Al, P, or As.

As described above, the semiconductor device of the present embodiment includes the films 17 between the insulator 5a and the insulators 5b, the films 17 including C, Ge, Sn, Al, P, or As. Therefore, the present embodiment makes it possible to favorably form insulating materials related to the stacked film 12, such as the insulator 5a near the stacked film 12. For example, the present embodiment makes it possible to prevent the insulator 5a from being etched by the chemical solution when the sacrificial layers 15 to be replaced with the electrode layers 6 are removed by the chemical solution.

The films 17 of the present embodiment are selectively provided on the side faces of the electrode layers 6 (sacrificial layers 15), and this makes it possible to prevent the films 17 on the side faces of the insulating layers 13 from influencing the memory cell transistor. On the other hand, the film 16 of the second embodiment is also provided on the side faces of the insulating layers 13, and this makes it possible to protect the side faces of the insulating layers 13 by the film 16.

Fifth Embodiment

Figure 22:
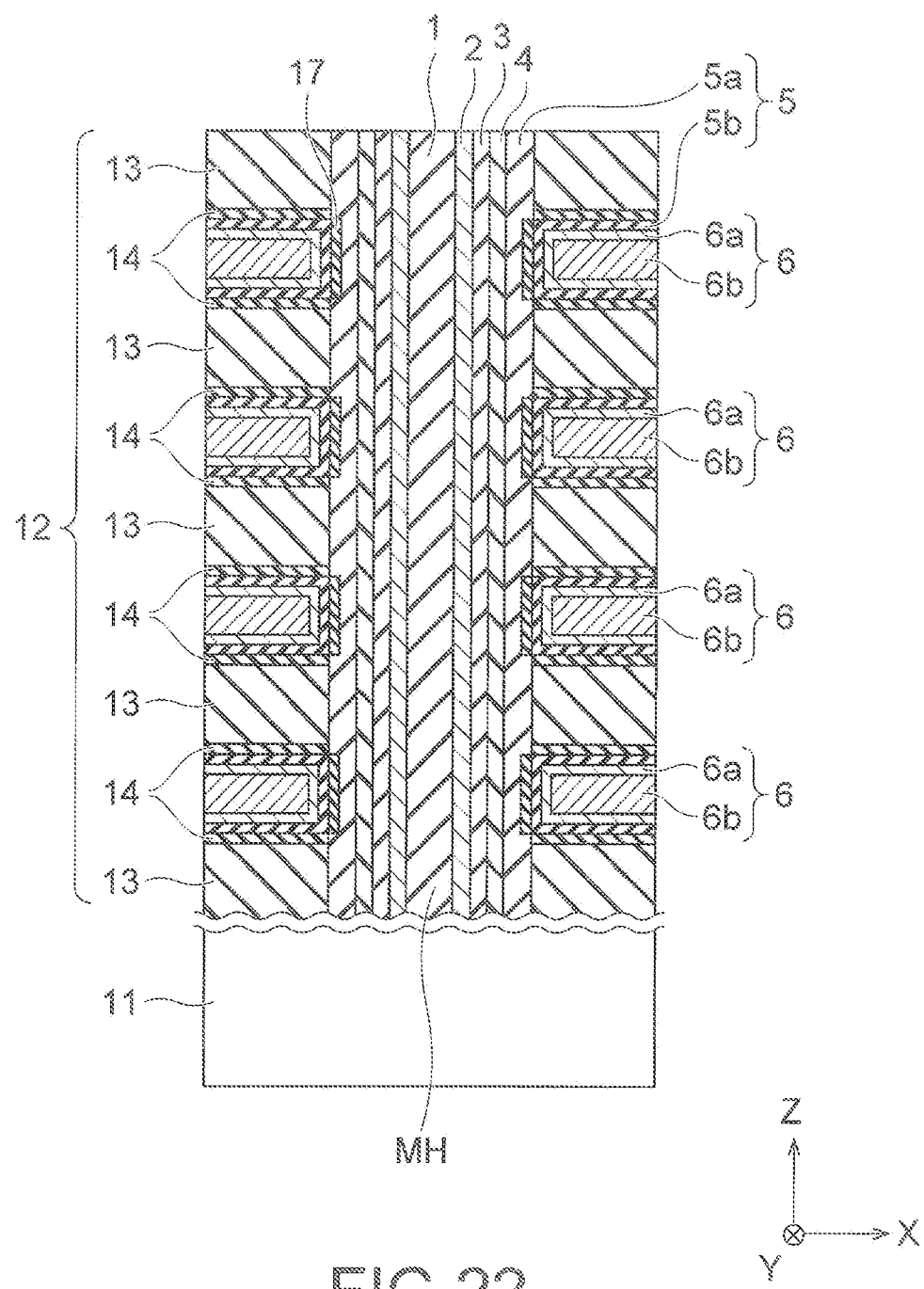
FIG. 22 is a cross-sectional view illustrating a structure of a semiconductor device of a fifth embodiment.

FIG. 22 is a cross-sectional view illustrating a structure of a semiconductor device of the fifth embodiment.

The semiconductor device (FIG. 22) of the present embodiment includes the films 17 (FIG. 17) of the fourth embodiment in addition to the constituent elements of the semiconductor device (FIG. 2) of the first embodiment. That is, the semiconductor device of the present embodiment includes the plurality of films 14 and the plurality of films 17. Details of the films 14 and the films 17 of the present embodiment are the same as those of the films 14 of the first embodiment and the films 17 of the fourth embodiment.

FIGS. 23 to 26 are cross-sectional views illustrating a method of manufacturing the semiconductor device of the fifth embodiment.

Figure 23:
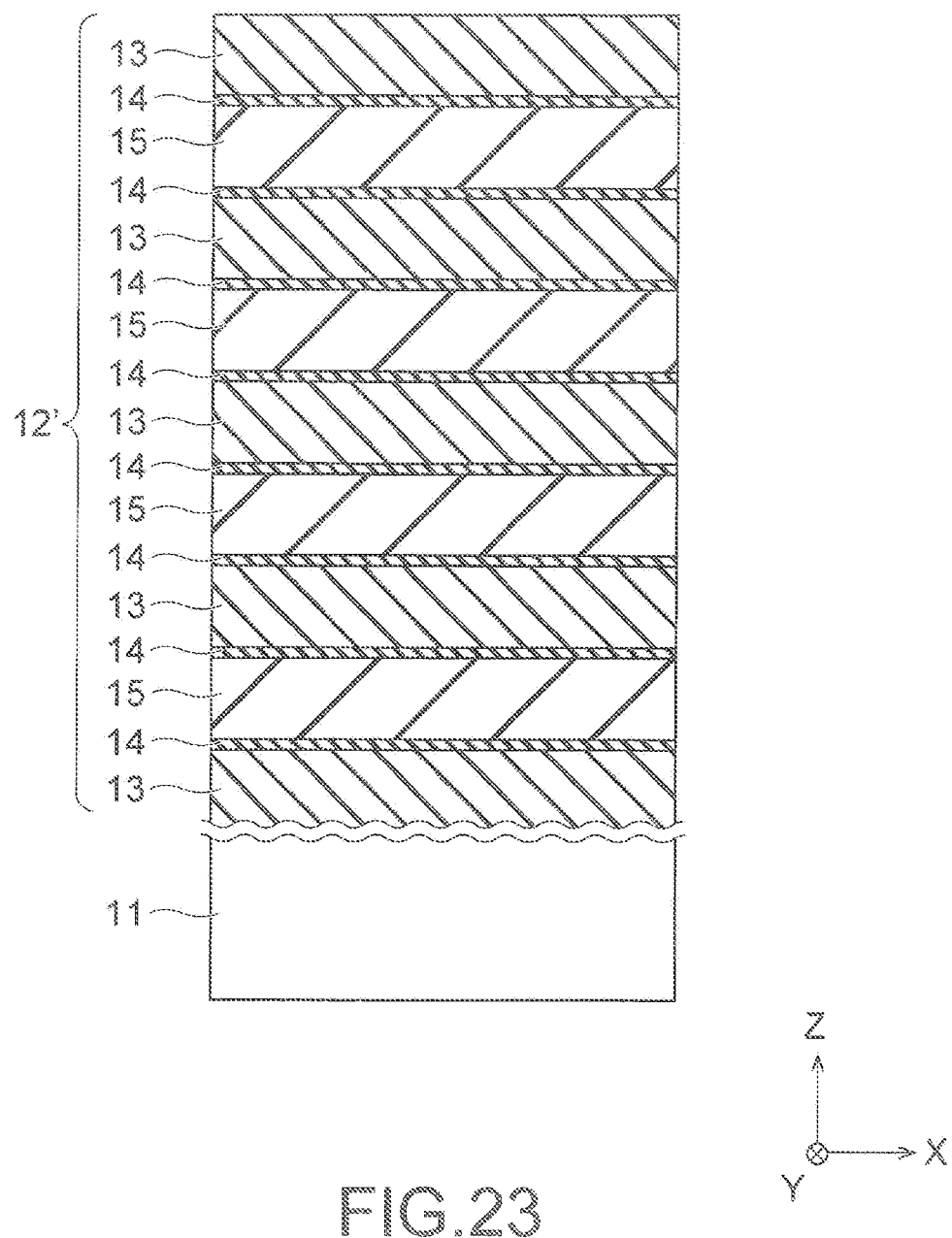
FIGS. 23 to 26 are cross-sectional views illustrating a method of manufacturing the semiconductor device of the fifth embodiment.
Figure 24:
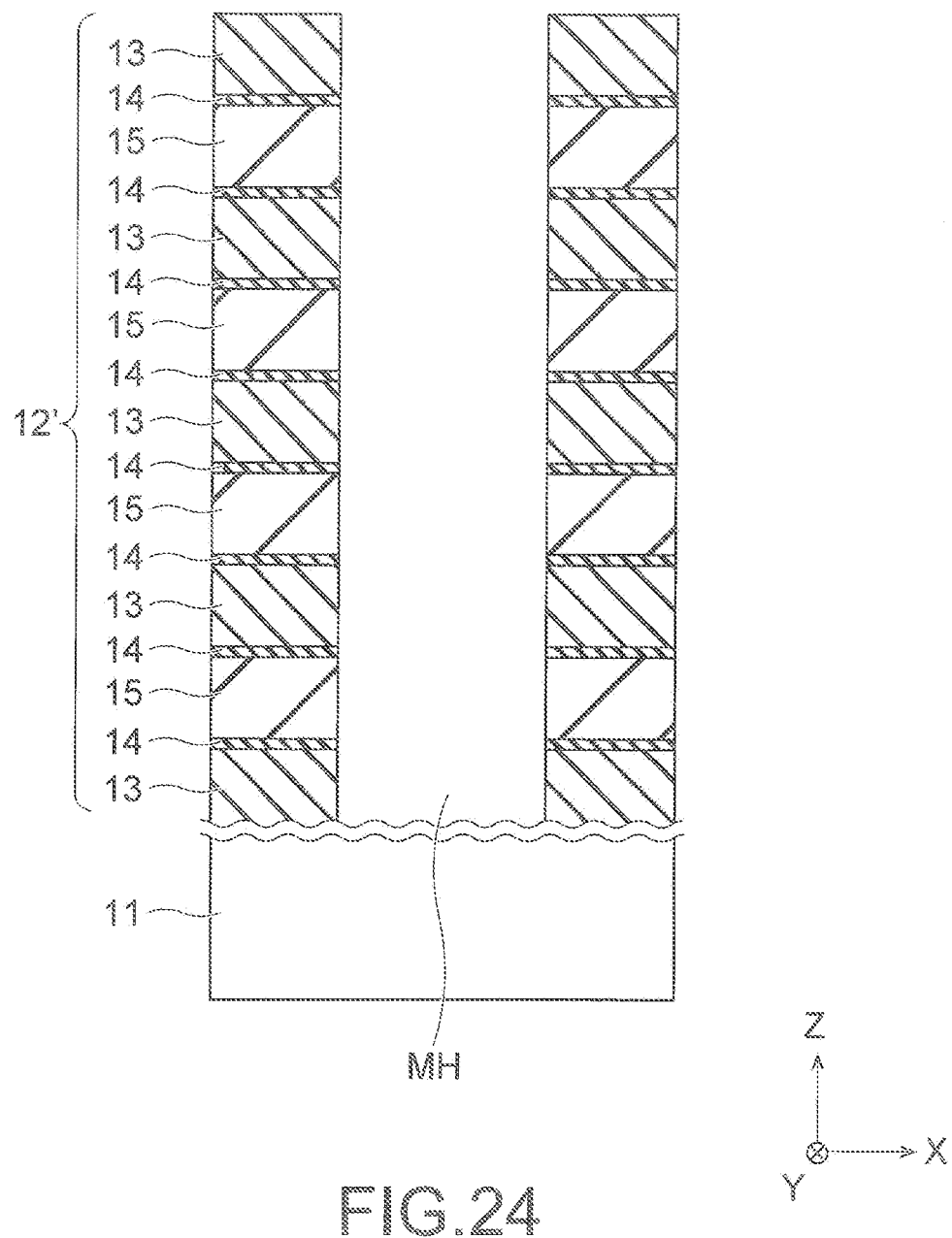

First, the stacked film 12' is formed on the substrate 11 (FIG. 23). The stacked film 12' is formed by alternately forming the plurality of insulating layers 13 and the plurality of sacrificial layers 15 on the substrate 11. At this time, the films 14 are respectively formed between the insulating layers 13 and the sacrificial layers 15. Then, the memory hole MH is formed in the stacked film 12' by lithography and RIE (FIG. 24).

Figure 25:
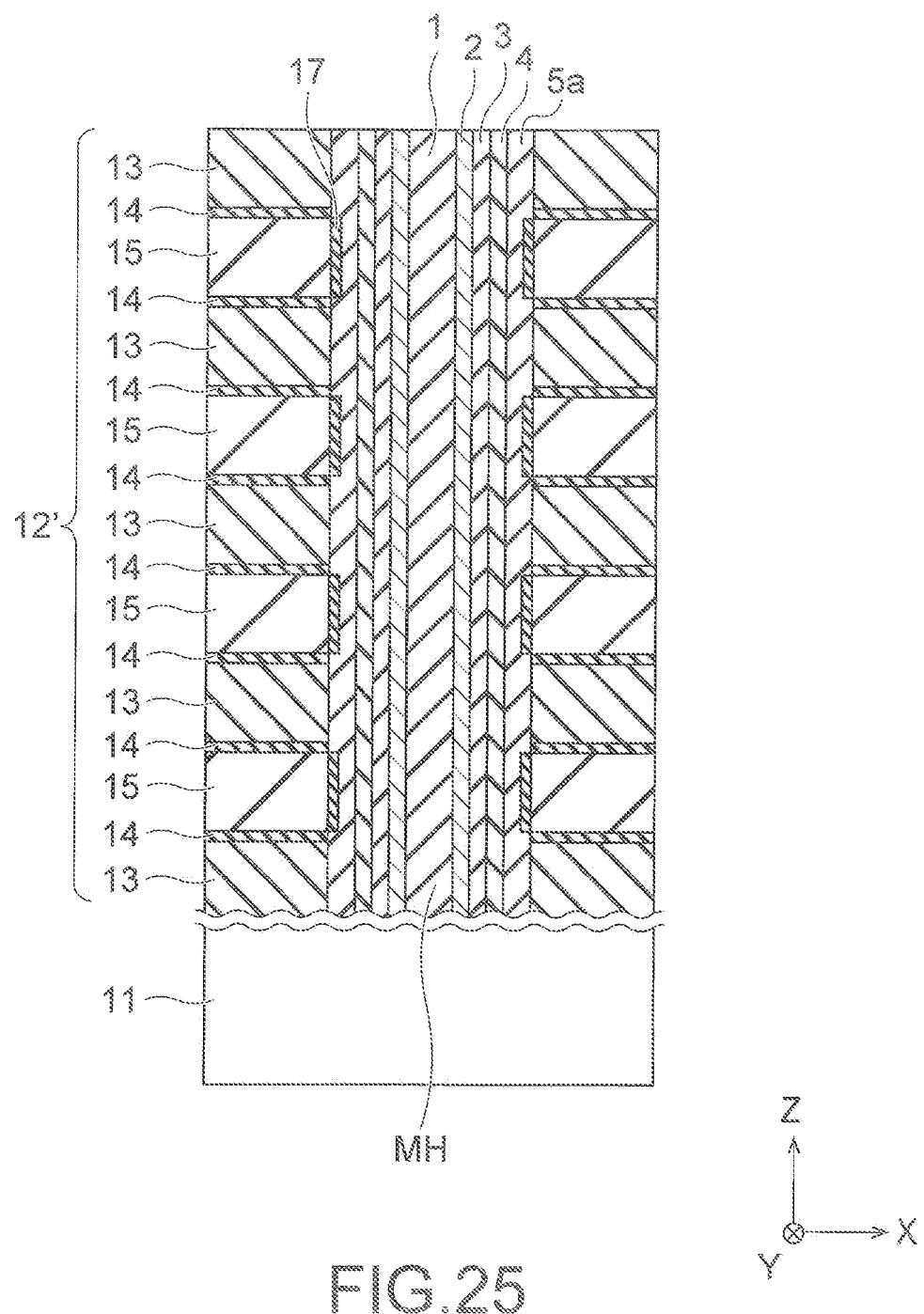

Next, the plurality of films 17 are selectively formed on the side faces of the sacrificial layers 15, of the side faces of the insulating layers 13 and the side faces of the sacrificial layers 15 inside of the memory hole MH (FIG. 25). As a result, these films 17 are formed in a state isolated from one another. Then, the insulator 5a, the charge storage layer 4, the tunnel insulator 3, the channel semiconductor layer 2, and the core insulator 1 are formed in the stated order on the entire surface of the substrate 11 (FIG. 25). As a result, the insulator 5a, the charge storage layer 4, the tunnel insulator 3, the channel semiconductor layer 2, and the core insulator 1 are formed in the stated order on the side face of the stacked film 12' inside of the memory hole MH, via the films 17.

Figure 26:
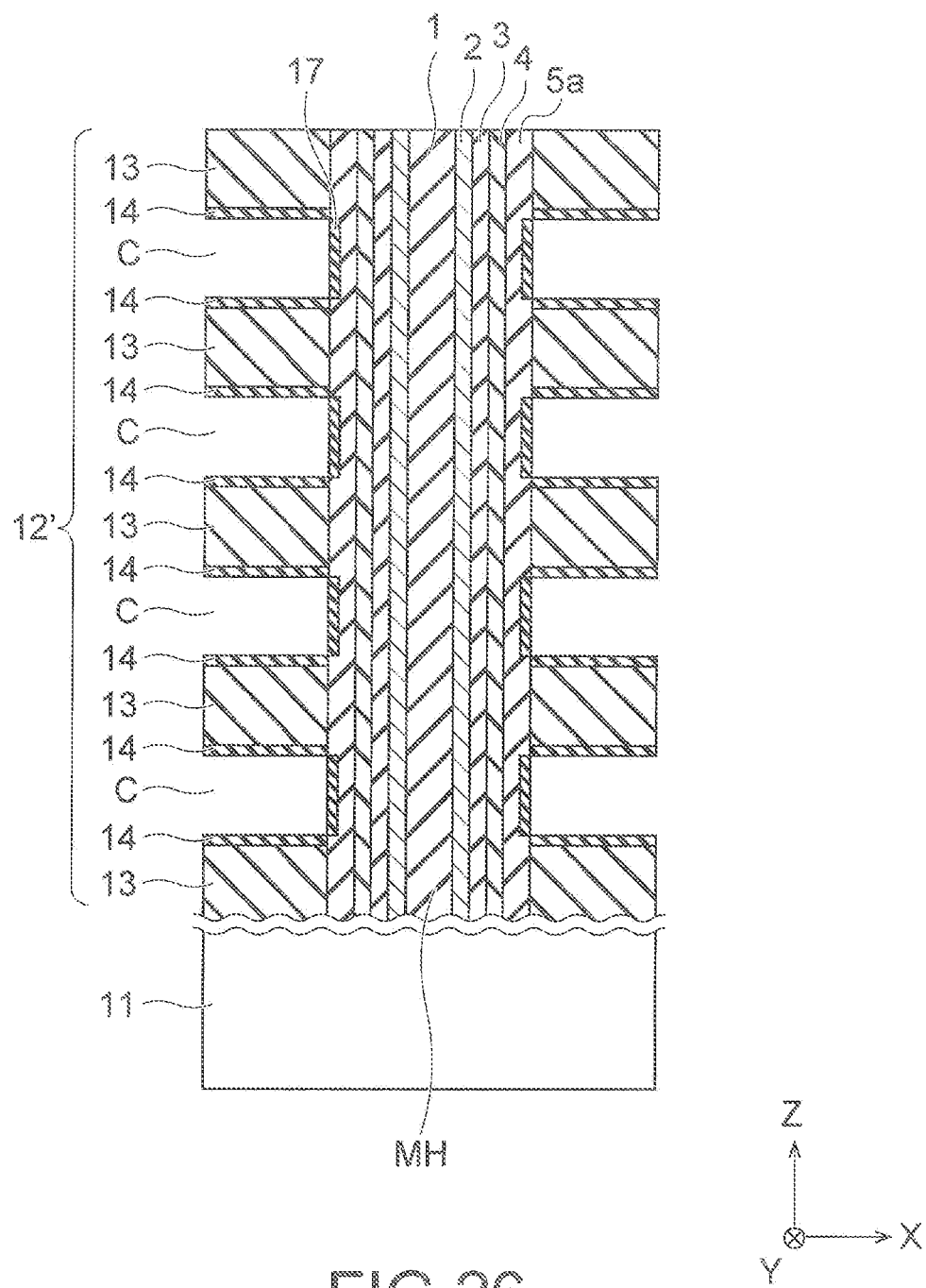

Next, slits are formed in the stacked film 12' by lithography and RIE, and the sacrificial layers 15 are removed by wet etching through the slits (FIG. 26). As a result, the plurality of cavities C are formed between the insulating layers 13 in the stacked film 12'. At this time, the films 14 and the films 17 remain, and hence the lower face of each film 14, the upper face of each film 14, and the side face of each film 17 are exposed in each cavity C. This wet etching is performed using, for example, heated phosphoric acid.

After that, the insulators 5b, the barrier metal layers 6a, and the electrode material layers 6b are respectively formed in the stated order in these cavities C. As a result, the plurality of electrode layers 6 are respectively formed in these cavities C via the insulators 5b, and the stacked film 12 is formed on the substrate 11 (see FIG. 22). In this way, the sacrificial layers 15 are respectively replaced with the electrode layers 6 and the insulators 5b, the stacked film 12 including the films 14 and the insulators 5b between the electrode layers 6 and the insulating layers 13 is formed, and the films 17 are sandwiched between the insulator 5a and the insulators 5b.

After that, various insulators, line layers, plug layers, and the like are formed on the substrate 11. In this way, the semiconductor device of the present embodiment is manufactured.

Now, further details of the method of manufacturing the semiconductor device of the present embodiment are described continuously with reference to FIGS. 23 to 26.

In the process illustrated in FIG. 26, the sacrificial layers 15 are removed by a chemical solution (for example, heated phosphoric acid), so that the cavities C are formed between the insulating layers 13. At this time, there is a possibility that a problem similar to that in the first embodiment occurs in the insulating layers 13, and there is a possibility that a problem similar to that in the fourth embodiment occurs in the insulator 5a. However, because the semiconductor device of the present embodiment includes the films 14 and the films 17, these problems can be prevented.

As described above, the semiconductor device of the present embodiment includes the films 14 between the electrode layers 6 and the insulating layers 13 that are adjacent to each other in the Z direction, the films 14 including C, Ge, Sn, Al, P, or As, and includes the films 17 between the insulator 5a and the insulators 5b, the films 17 including C, Ge, Sn, Al, P, or As. Therefore, the present embodiment makes it possible to favorably form insulating materials related to the stacked film 12, such as the insulating layers 13 in the stacked film 12 and the insulator 5a near the stacked film 12. For example, the present embodiment makes it possible to prevent the insulating layers 13 and the insulator 5a from being etched by the chemical solution when the sacrificial layers 15 to be replaced with the electrode layers 6 are removed by the chemical solution.

The films 17 of the present embodiment are selectively provided on the side faces of the electrode layers 6 (sacrificial layers 15), and this makes it possible to prevent the films 17 on the side faces of the insulating layers 13 from influencing the memory cell transistor. On the other hand, the film 16 of the third embodiment is also provided on the side faces of the insulating layers 13, and this makes it possible to protect the side faces of the insulating layers 13 by the film 16.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a stacked film alternately including a plurality of electrode layers and a plurality of insulating layers;
   a charge storage layer provided on a side face of the stacked film via a first insulator;
   a semiconductor layer provided on a side face of the charge storage layer via a second insulator;
   a third insulator provided between an electrode layer and an insulating layer in the stacked film and between the electrode layer and the first insulator, the third insulator including a metal element; and
   a first film including carbon, germanium, tin, aluminum, phosphorus, or arsenic, the first film not being provided between the third insulator and the insulating layer, and being provided between the third insulator and the first insulator,
   wherein:
   the device comprises, as the first film, a film continuously provided on side faces of the plurality of electrode layers and side faces of the plurality of insulating layers, or a plurality of films provided on the side faces of the plurality of electrode layers and isolated from one another,
   a thickness of the first film is 1 to 7 nm,
   a concentration of carbon, germanium, tin, aluminum, phosphorus, or arsenic included in the first film is 1 to 10 atomic %,
   a thickness of the insulating layer is 10 to 40 nm, and
   a total thickness of the electrode layer and the third insulator between the insulating layers is 10 to 40 nm.

2. A semiconductor device comprising:
   a stacked film alternately including a plurality of electrode layers and a plurality of insulating layers;
   a charge storage layer provided on a side face of the stacked film;
   a semiconductor layer provided on a side face of the charge storage layer; and
   a first film including carbon, the first film not being provided between an electrode layer and an insulating layer in the stacked film, and being provided between the electrode layer and the charge storage layer,
   wherein:
   the device comprises, as the first film, a film continuously provided on side faces of the plurality of electrode layers and side faces of the plurality of insulating layers, or a plurality of films provided on the side faces of the plurality of electrode layers and isolated from one another,
   a thickness of the first film is 1 to 7 nm,
   a concentration of carbon, germanium, tin, aluminum, phosphorus, or arsenic included in the first film is 1 to 10 atomic %,
   a thickness of the insulating layer is 10 to 40 nm.

3. The device of claim 2, wherein the first film includes silicon and carbon.

4. The device of claim 2, wherein the first film includes an SiCN film, an SiOC film, or an SiOCN film, where N denotes nitrogen and O denotes oxygen.

\* \* \* \* \*